(12) United States Patent
Sirichai

(10) Patent No.: US 9,634,711 B2
(45) Date of Patent: Apr. 25, 2017

(54) UNIVERSAL DEVICE-HOLDING CASE CONSTRUCTION WITH MAGNETIC FASTENER FEATURE

(71) Applicant: Saharut Sirichai, Bangkok (TH)

(72) Inventor: Saharut Sirichai, Bangkok (TH)

(73) Assignee: WORLD RICHMAN MANUFACTURING CORPORATION, Elgin, IL (US)

( * ) Notice: Subject to any disclaimer, the term of this patent is extended or adjusted under 35 U.S.C. 154(b) by 0 days.

(21) Appl. No.: 14/830,495

(22) Filed: Aug. 19, 2015

(65) Prior Publication Data

US 2016/0233911 A1   Aug. 11, 2016

Related U.S. Application Data

(60) Provisional application No. 62/039,145, filed on Aug. 19, 2014, provisional application No. 62/039,162, filed on Aug. 19, 2014.

(51) Int. Cl.

| | |
|---|---|
| *H04M 1/00* | (2006.01) |
| *H04B 1/3888* | (2015.01) |
| *A45C 11/00* | (2006.01) |
| *H01F 7/02* | (2006.01) |
| *G06F 1/18* | (2006.01) |
| *H05K 5/00* | (2006.01) |
| *H05K 5/02* | (2006.01) |
| *H05K 5/03* | (2006.01) |

(52) U.S. Cl.
CPC ............ *H04B 1/3888* (2013.01); *A45C 11/00* (2013.01); *G06F 1/182* (2013.01); *H01F 7/0242* (2013.01); *H05K 5/0017* (2013.01); *H05K 5/0221* (2013.01); *H05K 5/03* (2013.01); *A45C 2011/002* (2013.01); *A45C 2011/003* (2013.01)

(58) Field of Classification Search
None
See application file for complete search history.

(56) References Cited

U.S. PATENT DOCUMENTS

| | | |
|---|---|---|
| 8,665,044 B2 | 3/2014 | Lauder et al. |
| 8,665,045 B2 | 3/2014 | Lauder et al. |
| | (Continued) | |

*Primary Examiner* — Idowu O Osifade
(74) *Attorney, Agent, or Firm* — Christopher J. Scott

(57) ABSTRACT

A case construction for an electronic device having a select feature function operable via a posterior device portion includes a device-holding panel for removably retaining an electronic device and a case construction for selectively enabling (a) device-holding panel access and (b) device-holding panel encasement. The device-holding panel includes an anterior device-support portion, a posterior case interface portion, at least one feature-enabling edge, and a device retention mechanism for retaining the electronic device in anterior adjacency to the anterior device-support portion. The case construction includes an anterior case portion, a posterior case portion, and an anterior-to-posterior junction. The anterior case portion is pivotal relative to the posterior case portion via the anterior-to-posterior junction for selectively uncovering and covering the anterior device-support portion. The device-holding panel is magnetically attractive and fastenable to the case construction via first and second magnetically attractive material constructions embedded within the device-holding panel and case construction.

19 Claims, 38 Drawing Sheets

(56) References Cited

U.S. PATENT DOCUMENTS

| | | |
|---|---|---|
| 8,672,126 B2 | 3/2014 | Rohrbach et al. |
| 2006/0187696 A1 | 8/2006 | Lanni |
| 2008/0002369 A1 | 1/2008 | Carnevali |
| 2011/0261509 A1 | 10/2011 | Xu et al. |
| 2012/0075789 A1 | 3/2012 | DeCamp et al. |
| 2015/0108186 A1* | 4/2015 | Law .................. G03B 17/568 224/191 |

* cited by examiner

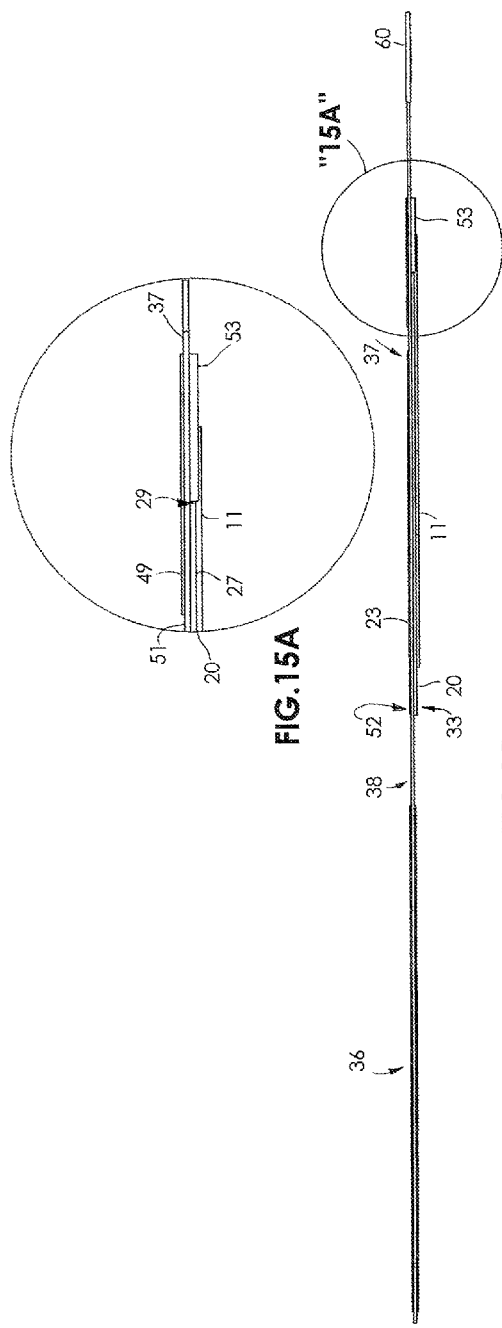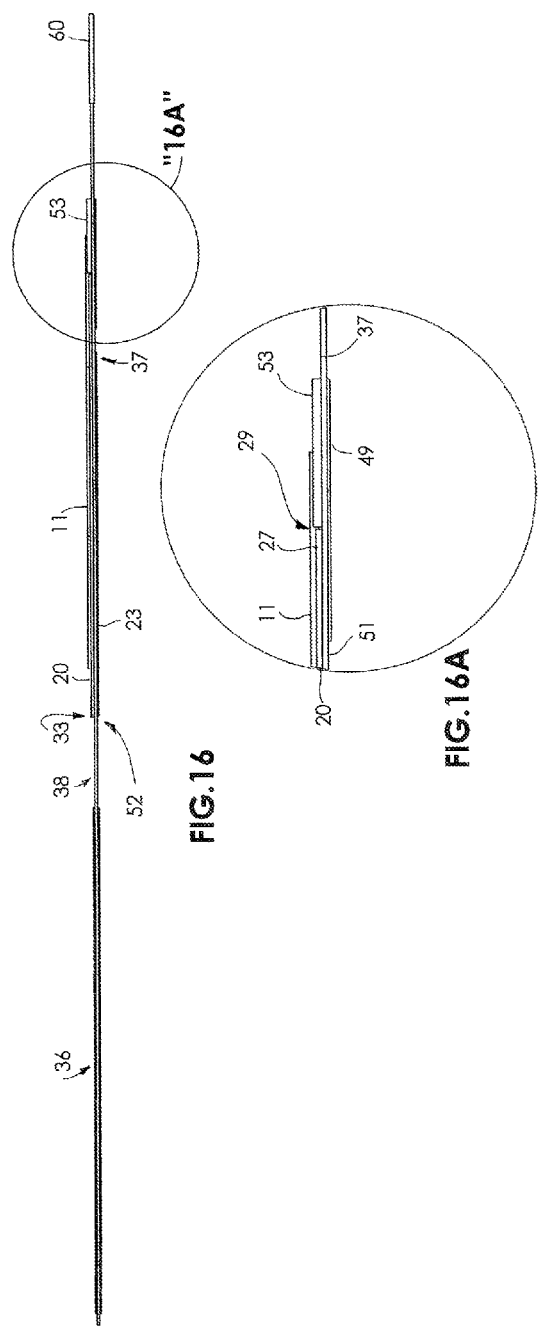

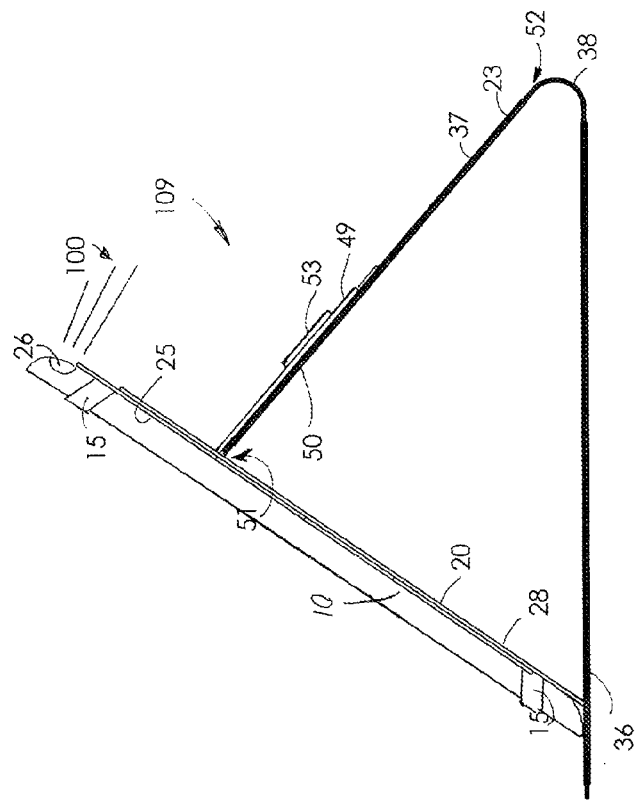
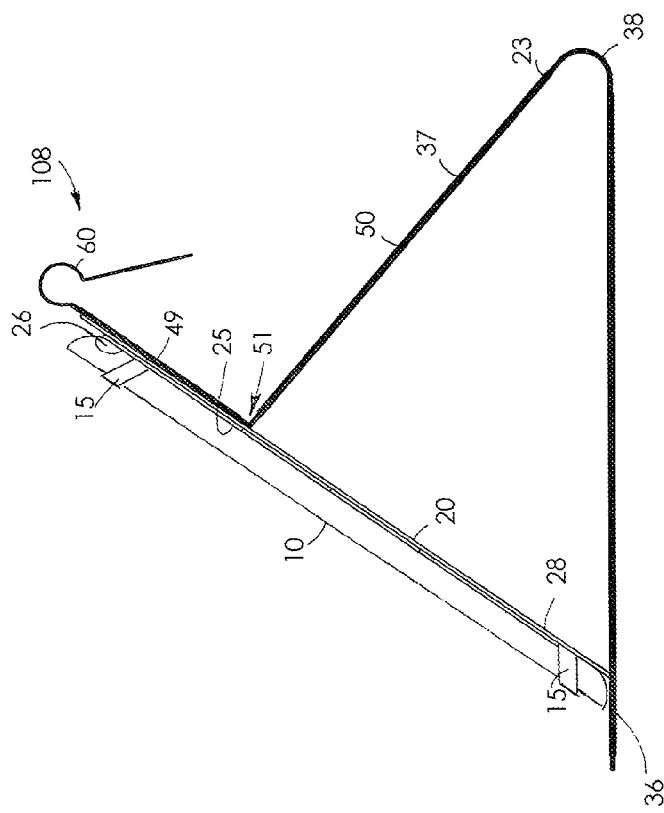

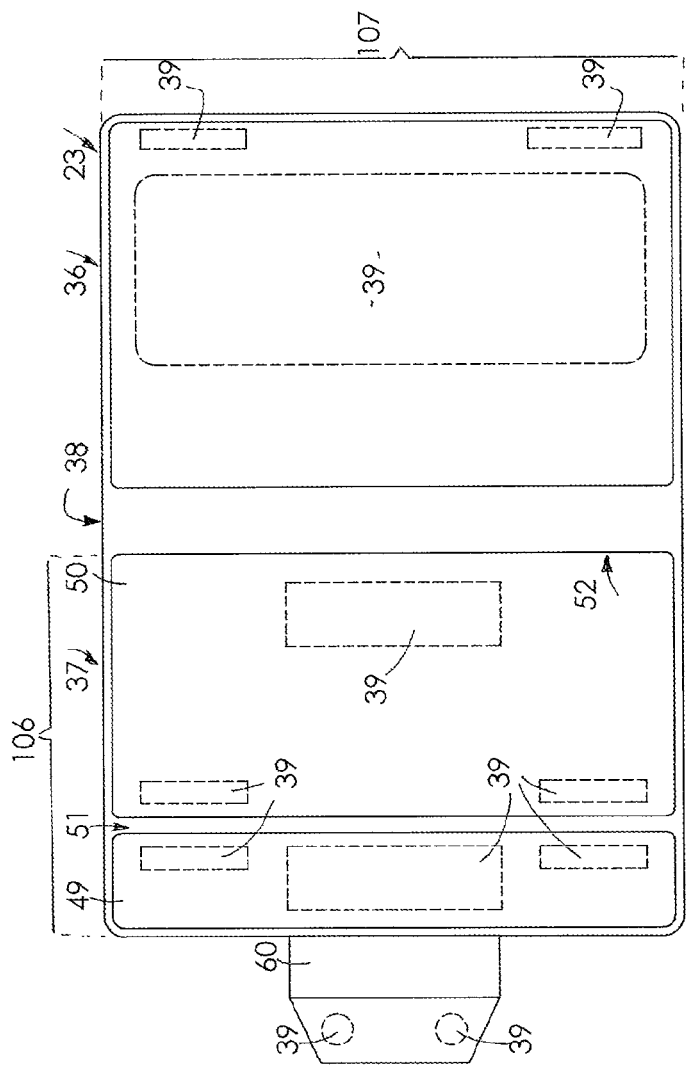
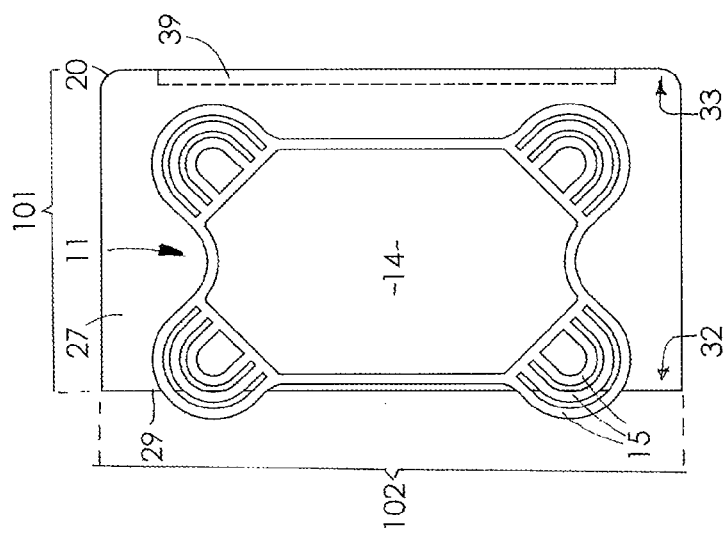
FIG. 24
FIG. 23

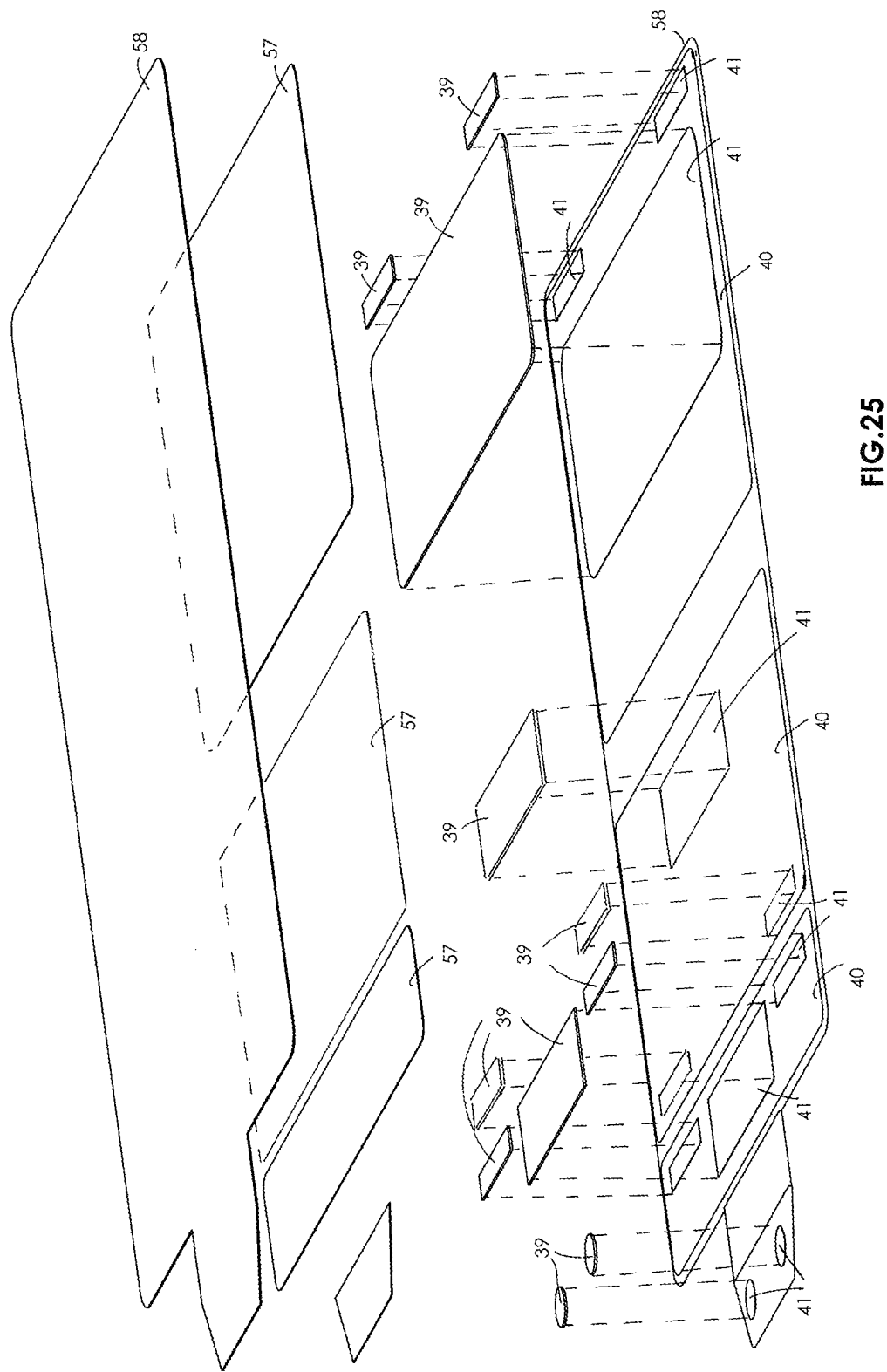

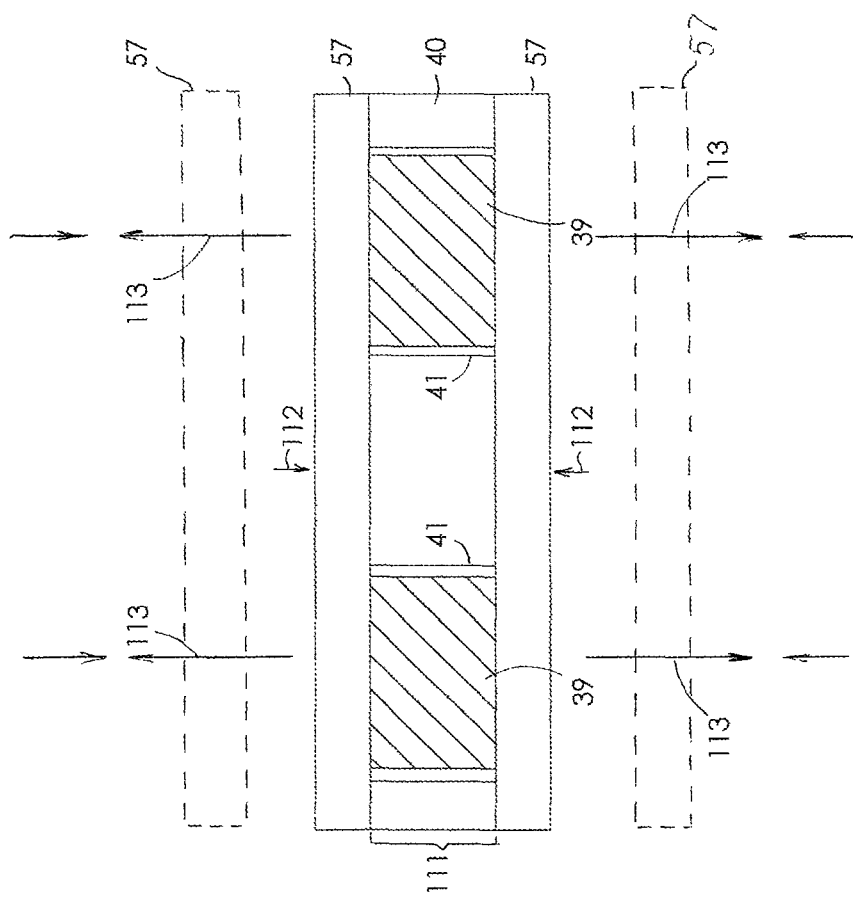

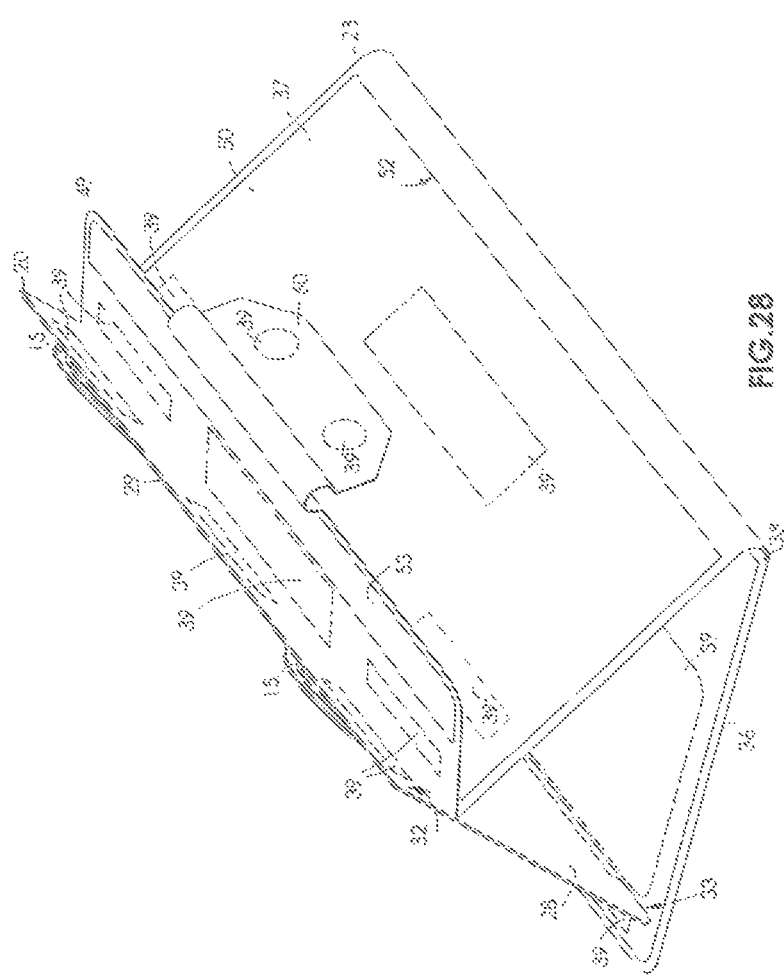

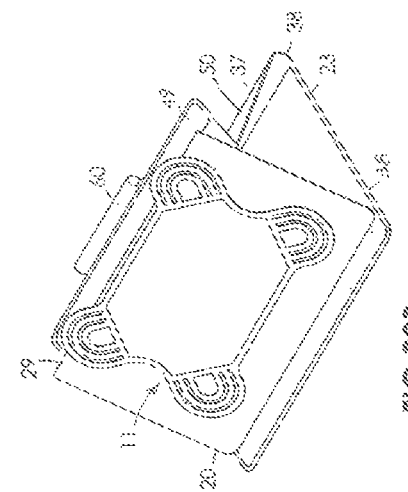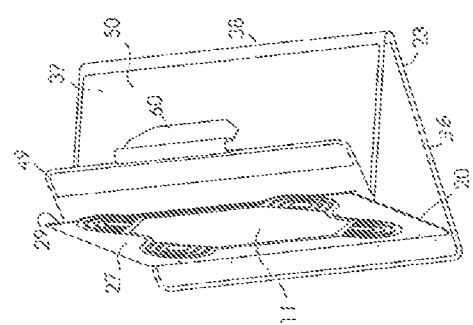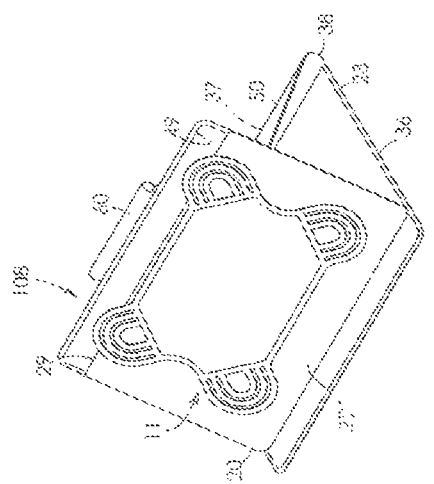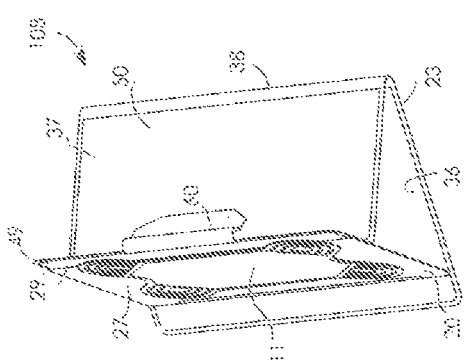

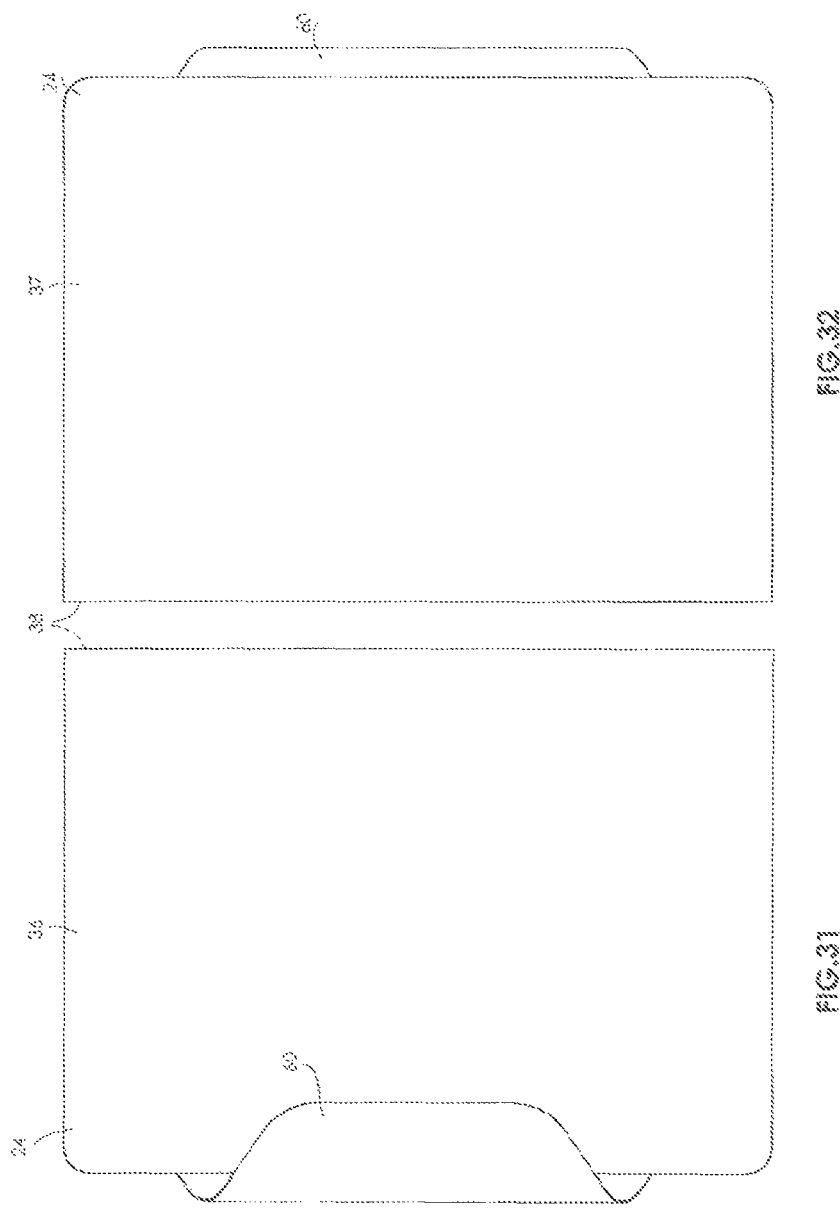

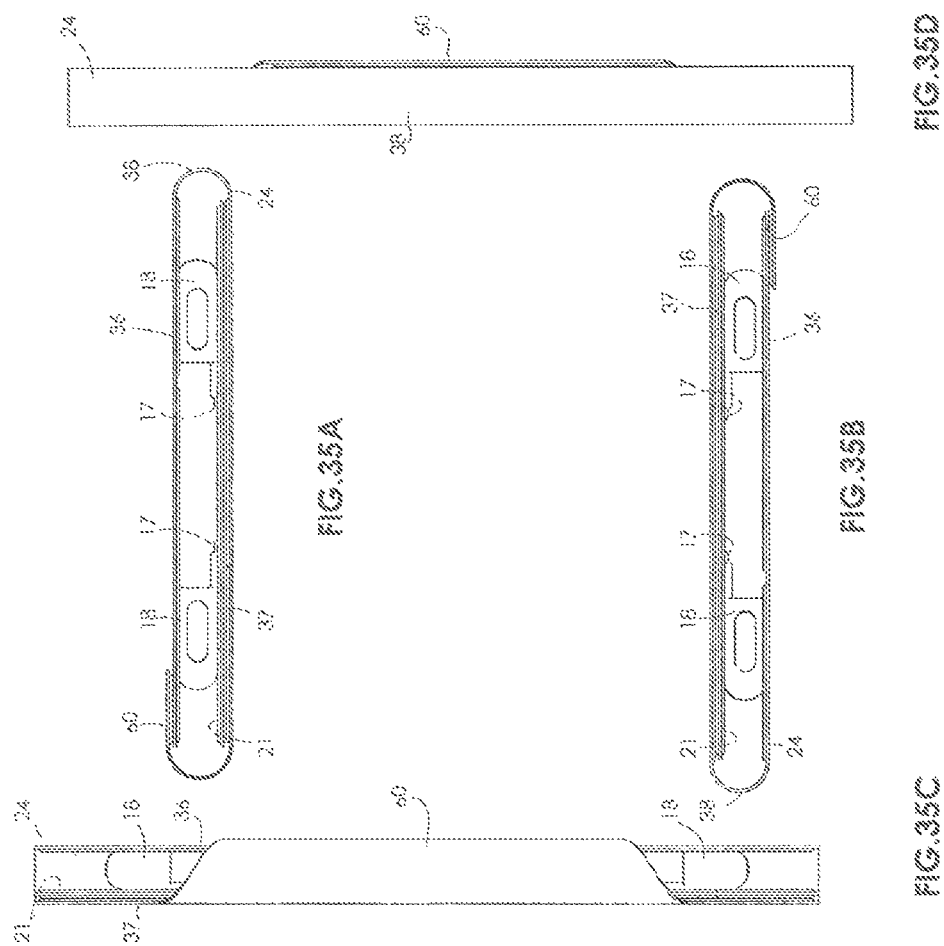

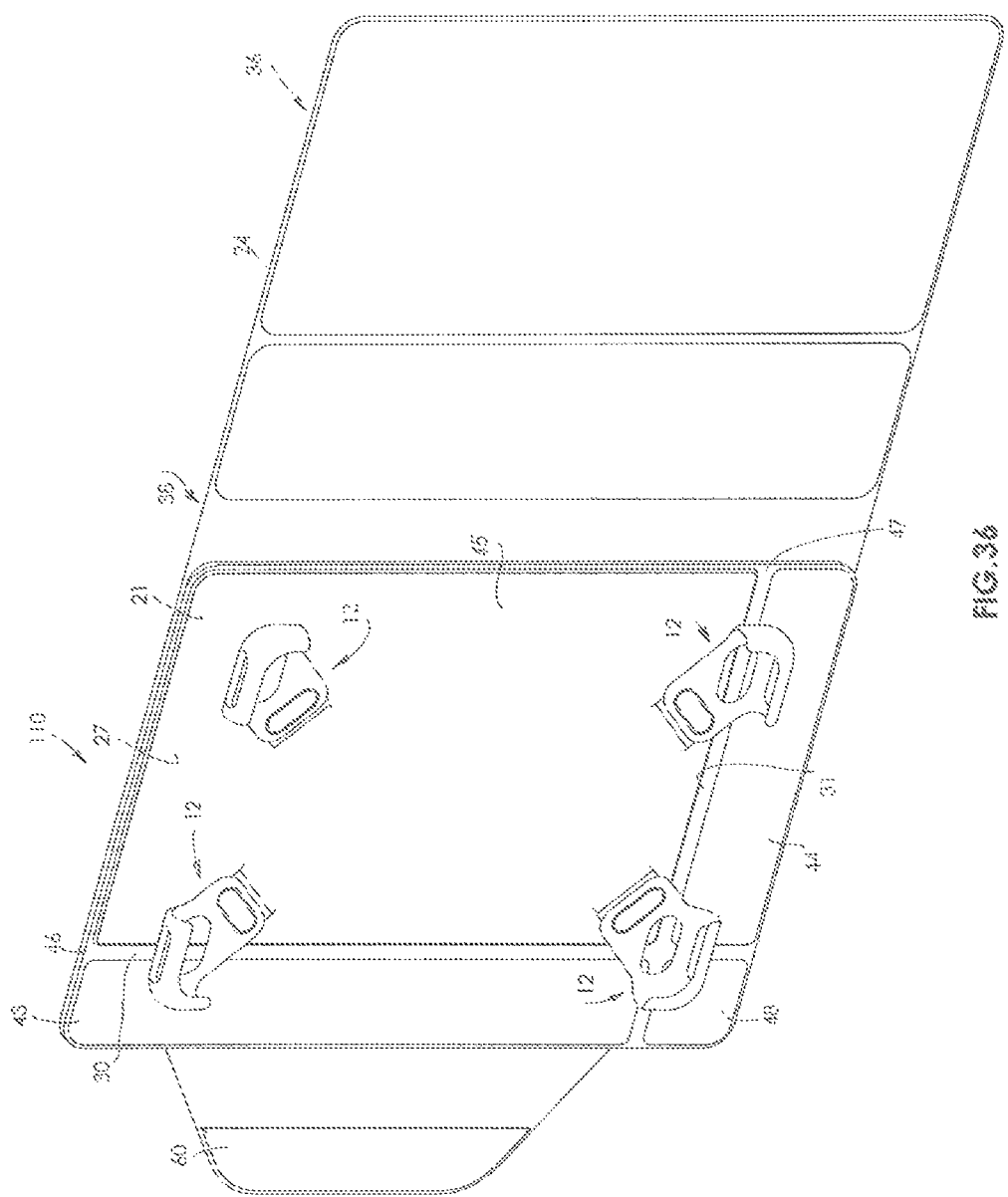

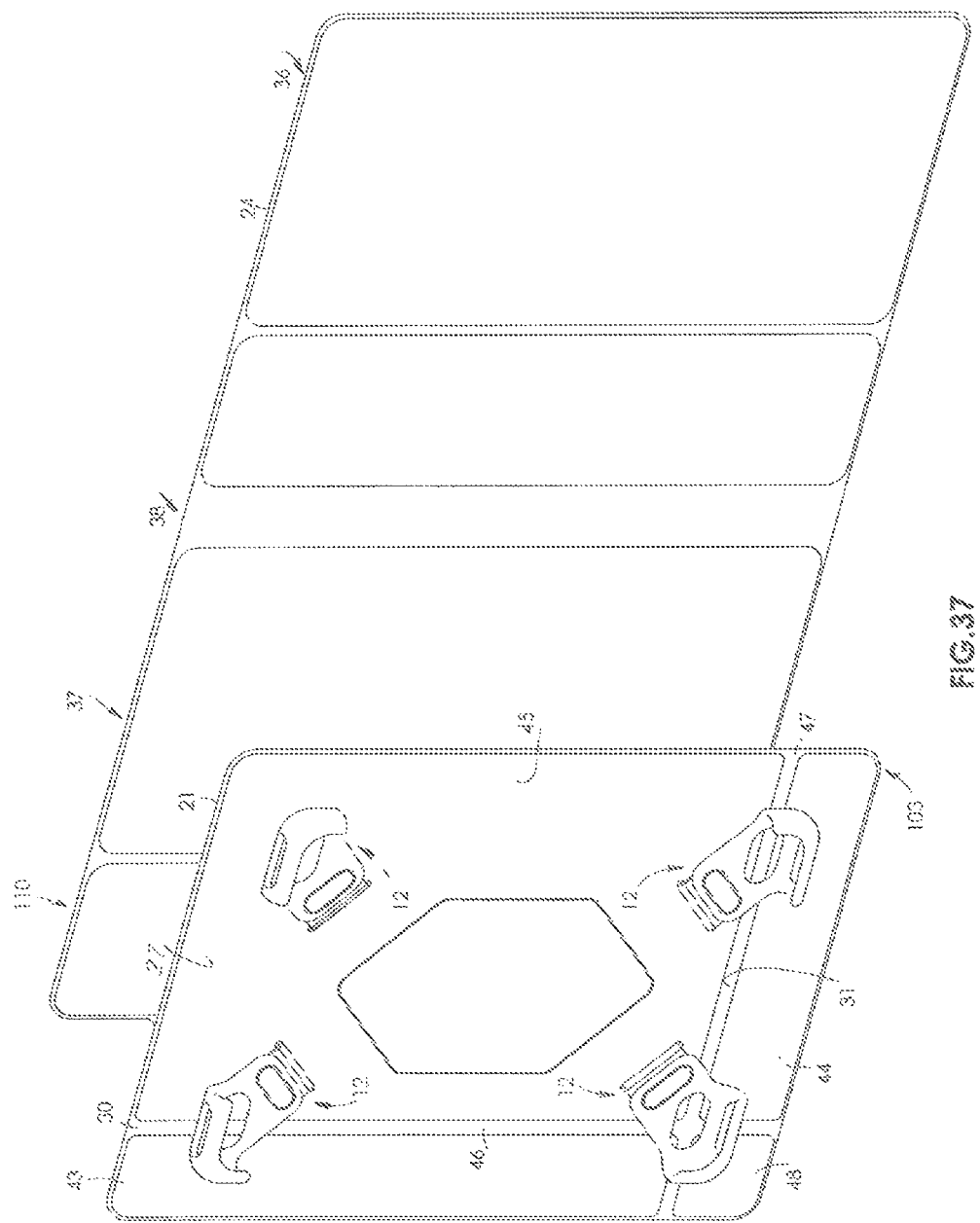

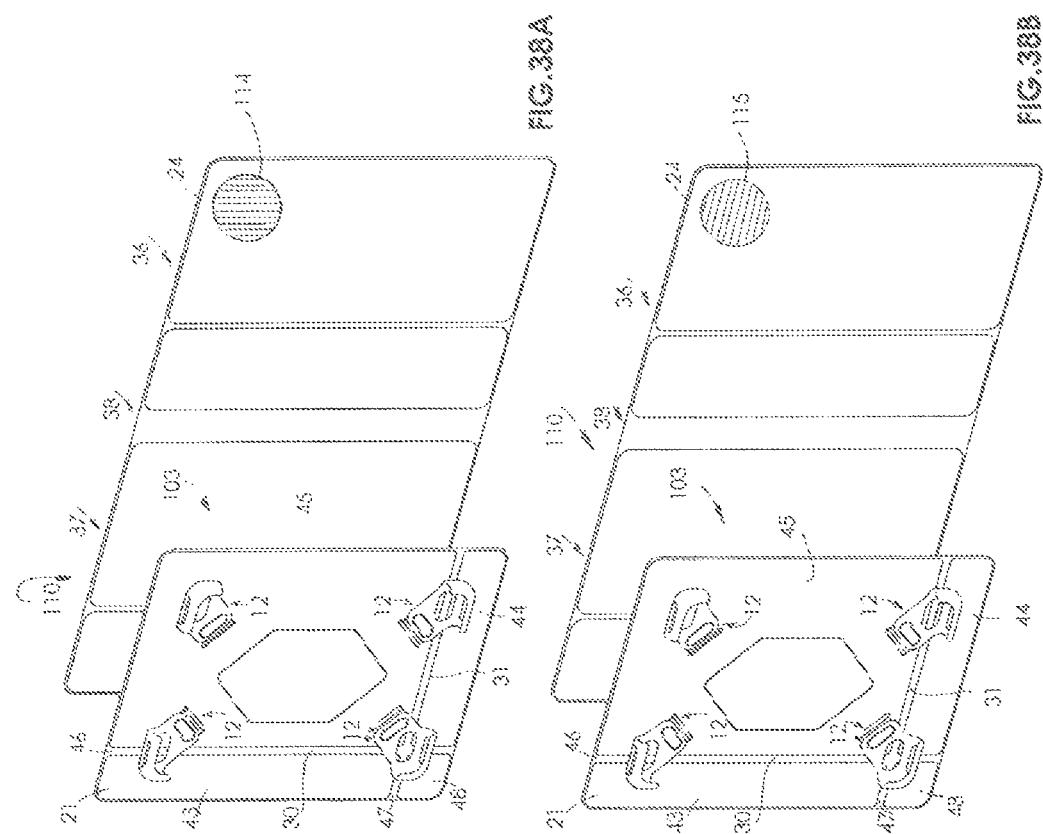

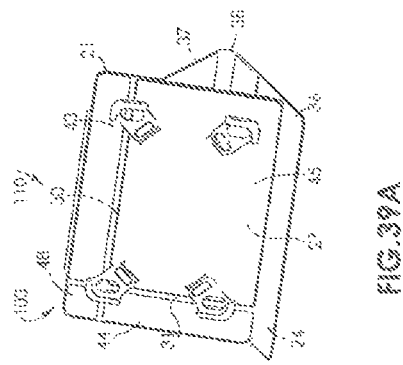
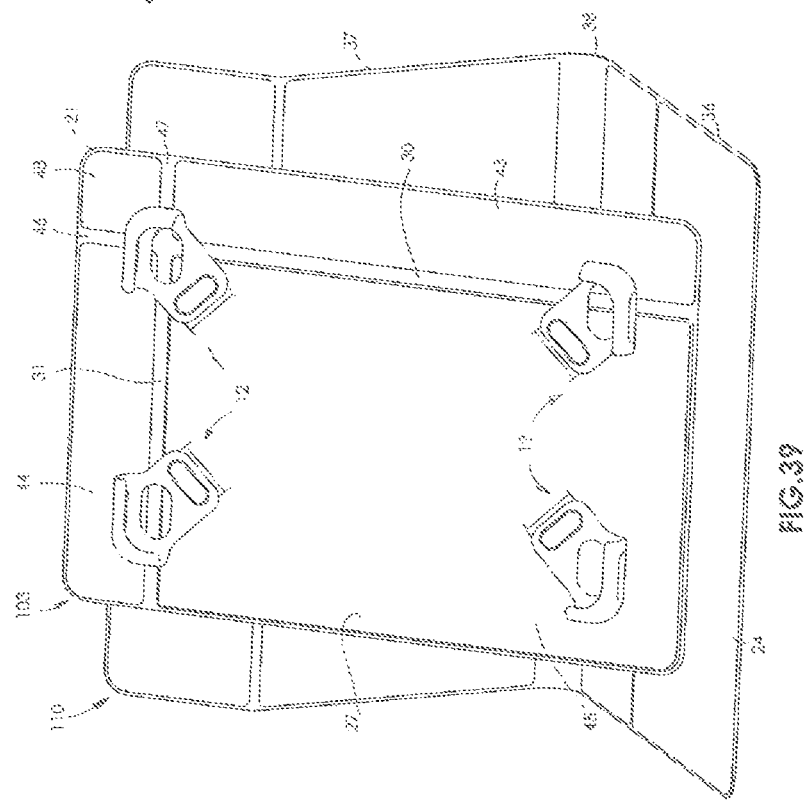

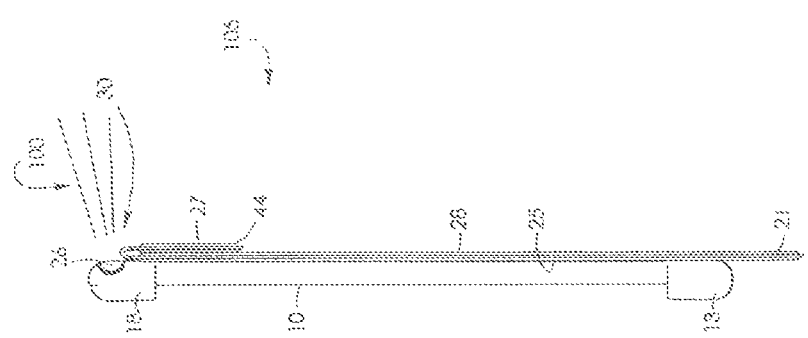
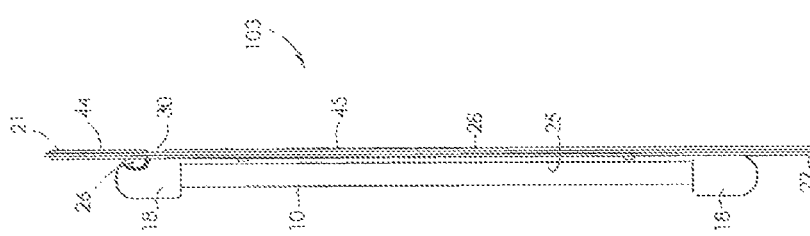

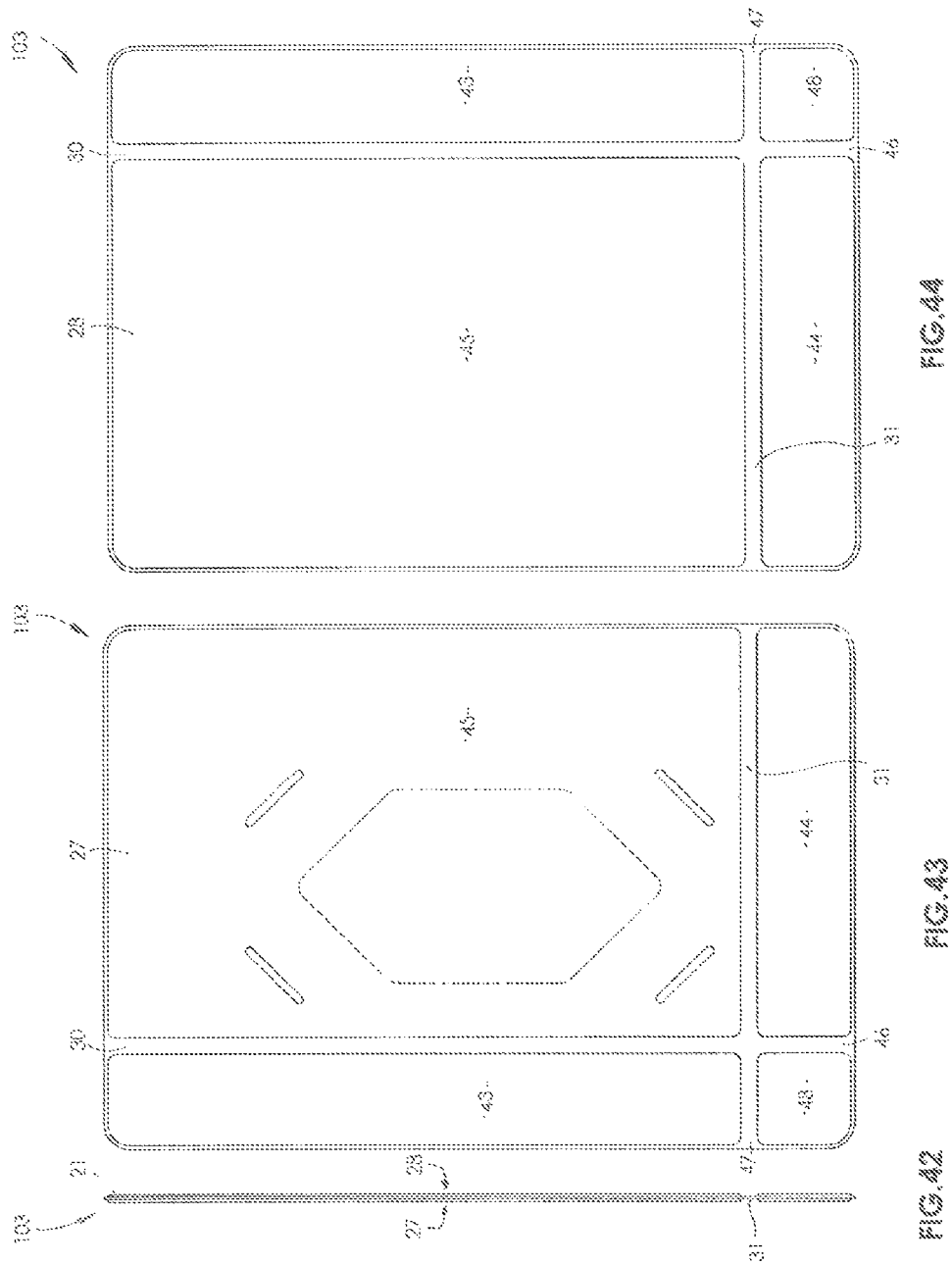

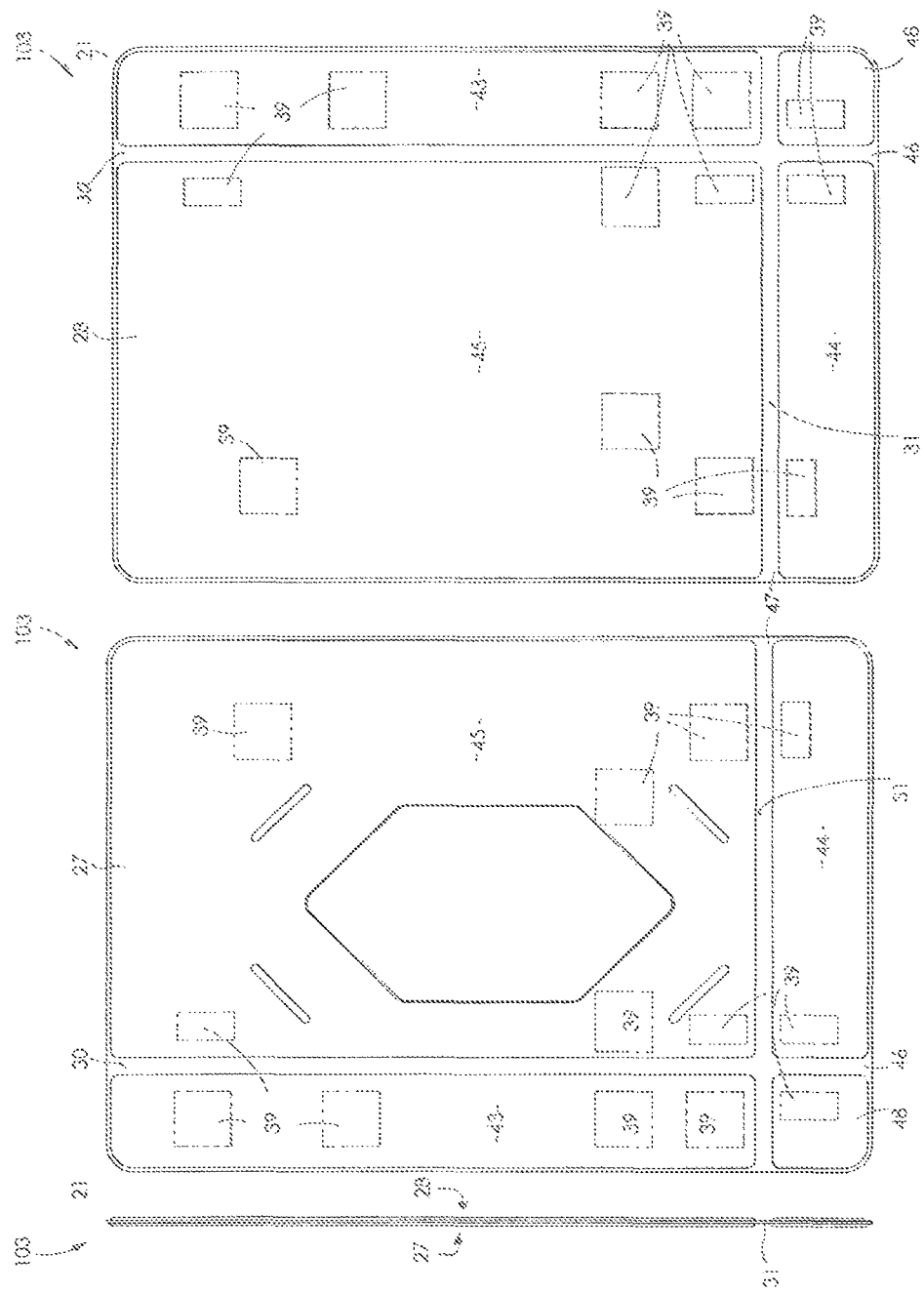

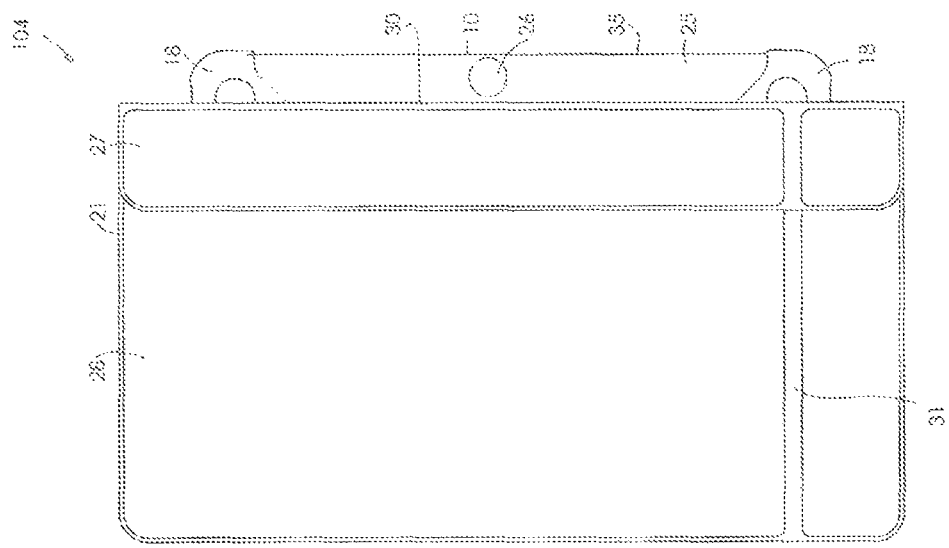
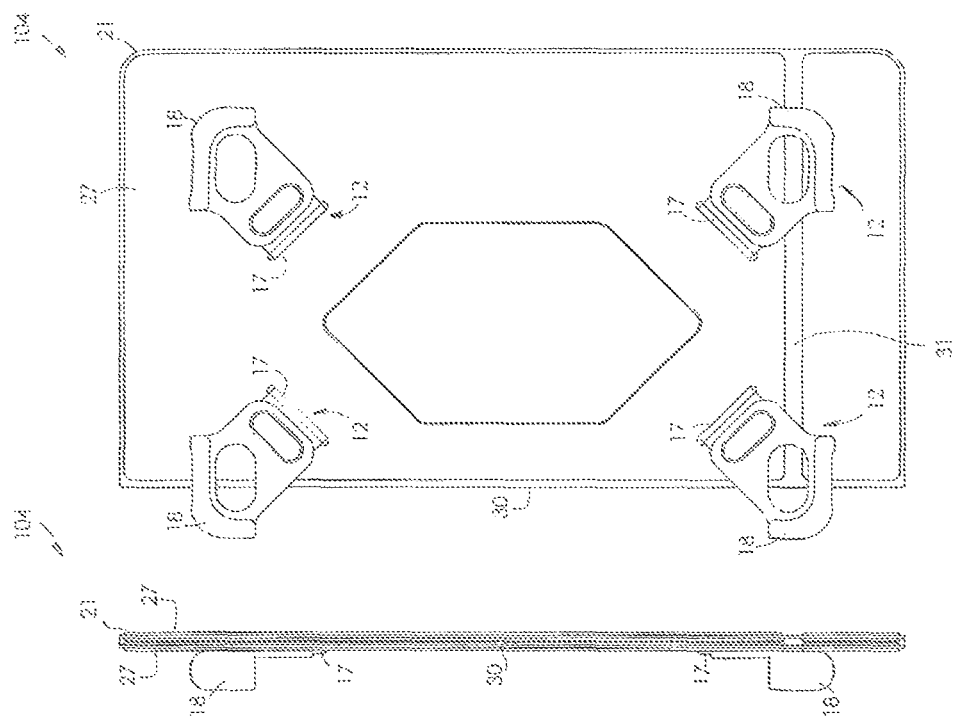

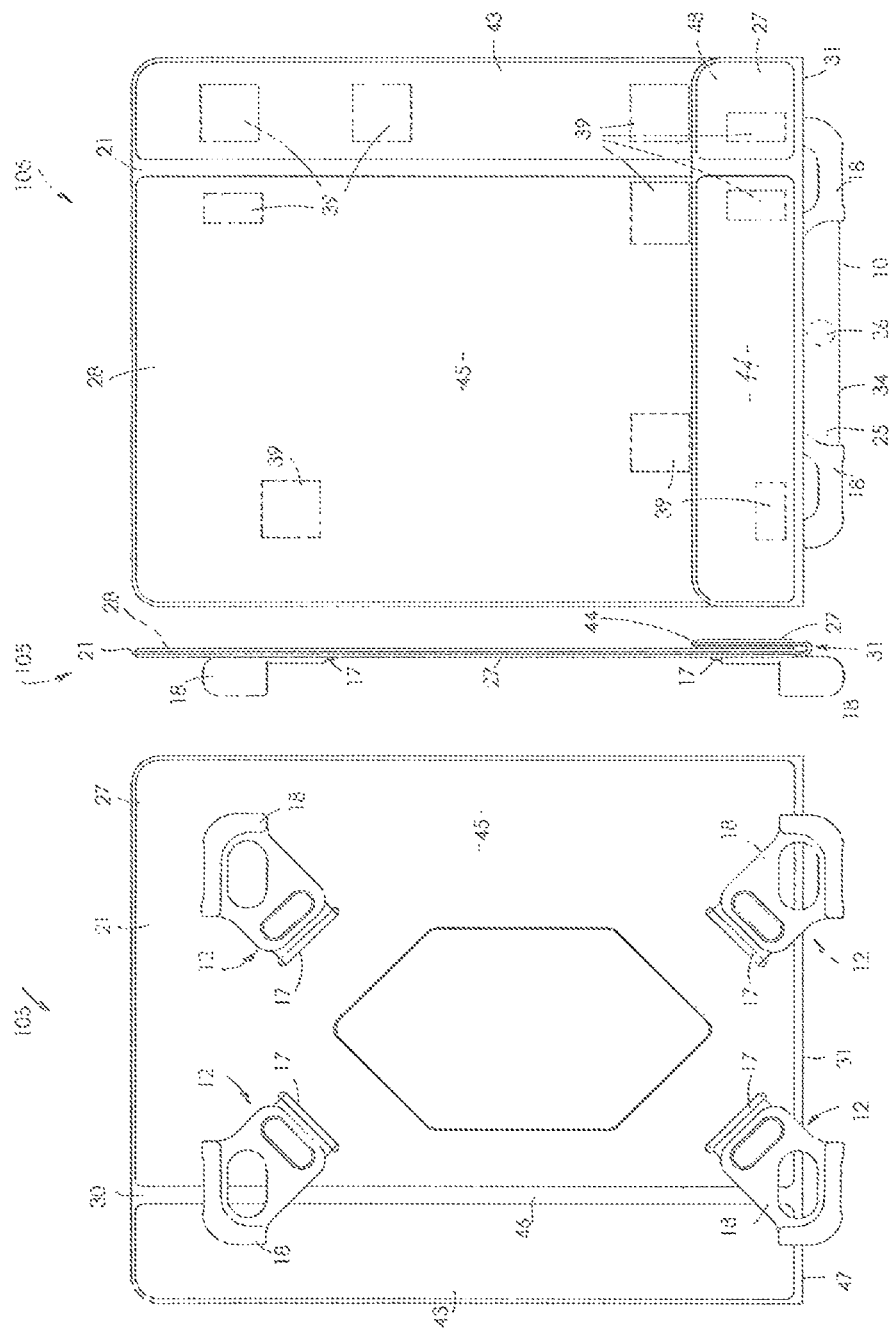

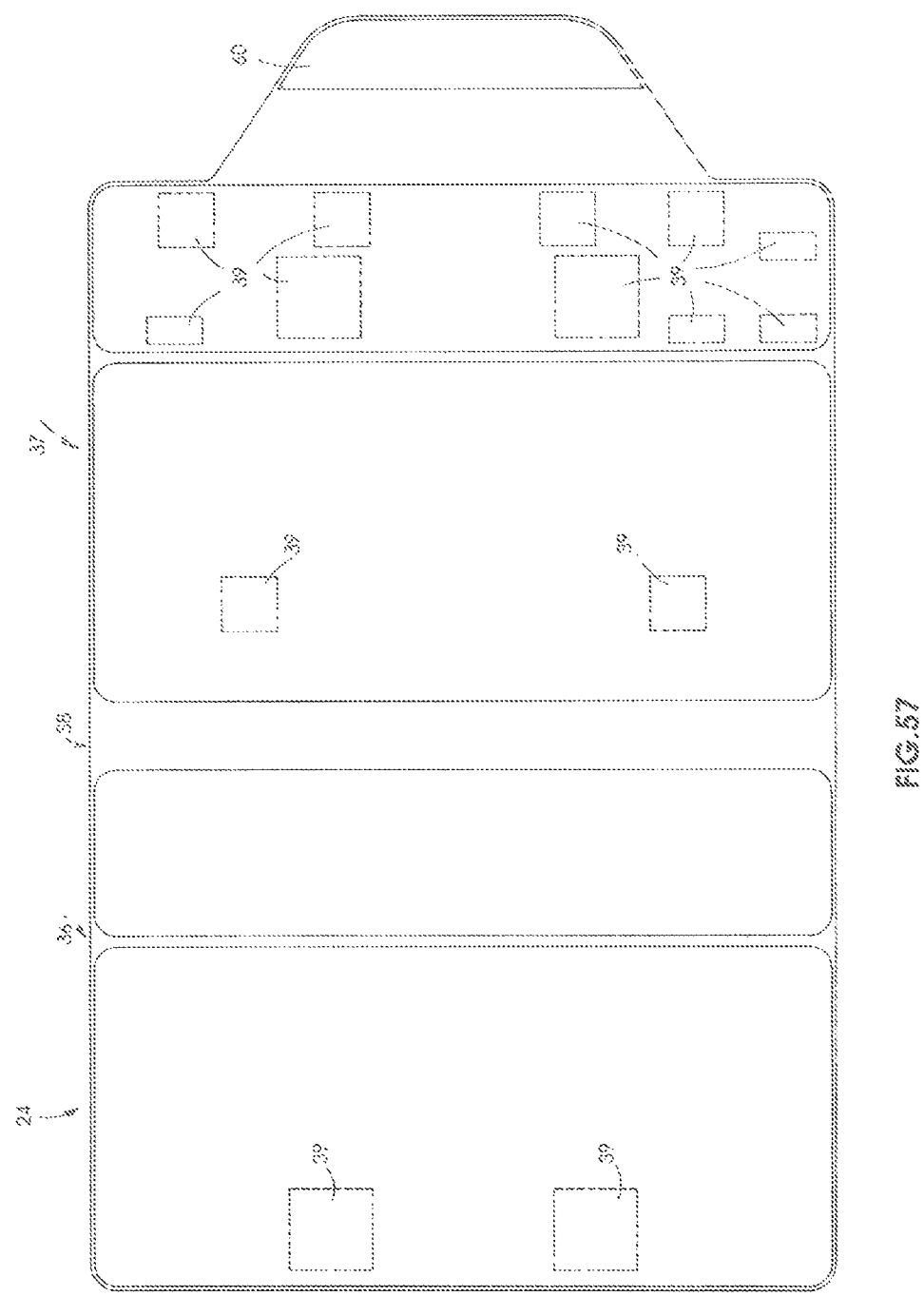

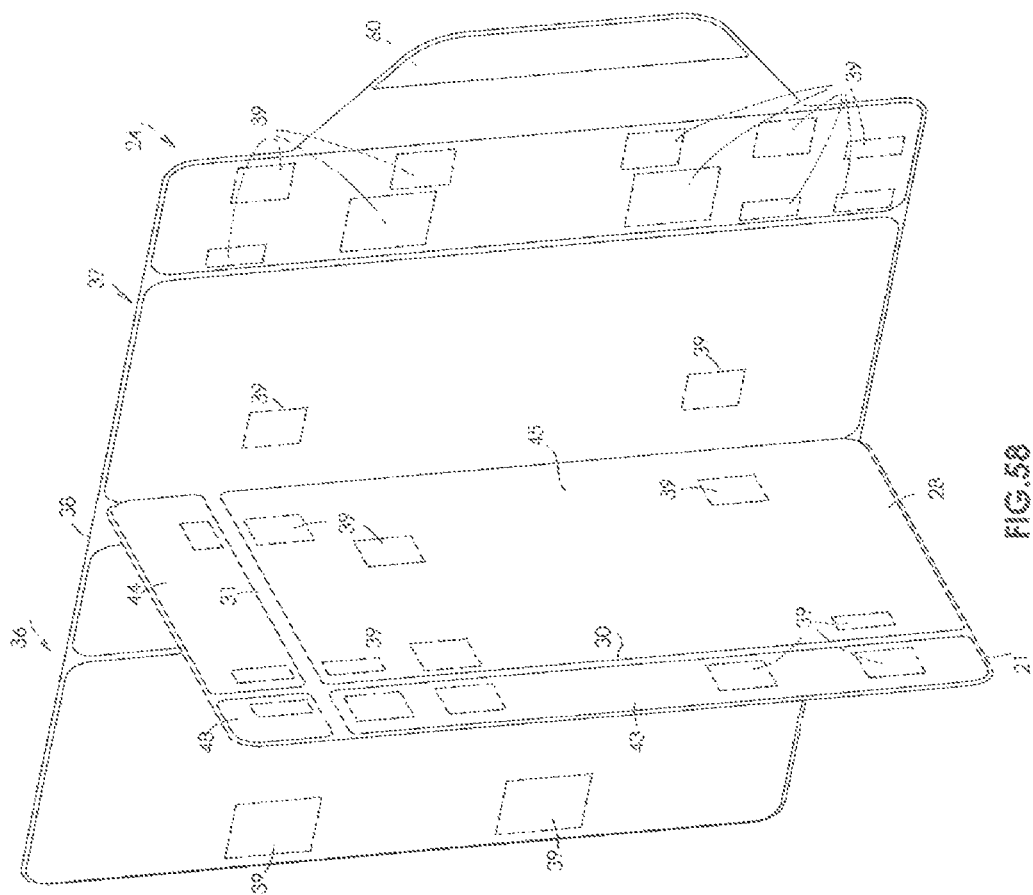

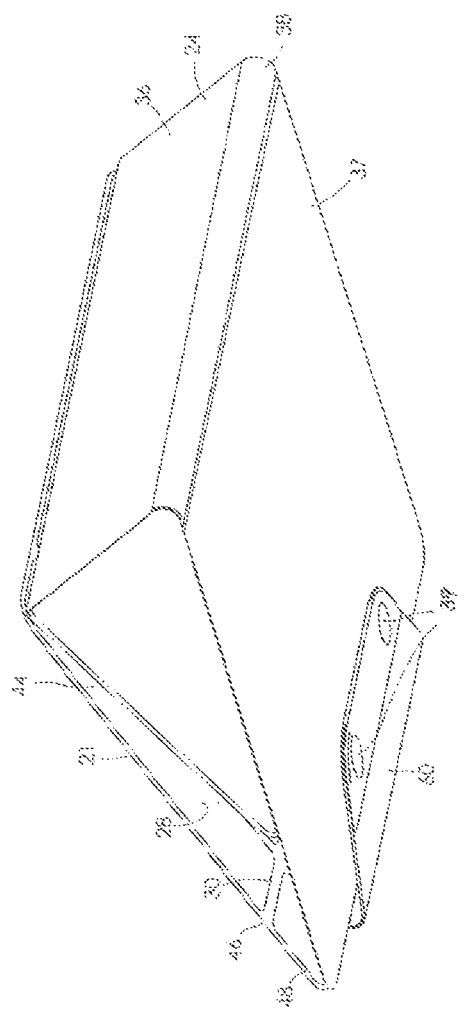

UNIVERSAL DEVICE-HOLDING CASE CONSTRUCTION WITH MAGNETIC FASTENER FEATURE

PRIOR HISTORY

This application (a) primarily claims the benefit of or priority to U.S. Provisional Patent Application No. 62/039,145 filed in the United States Patent and Trademark Office (USPTO) on 19 Aug. 2014, and (b) secondarily claims the benefit of or priority to U.S. Provisional Patent Application No. 62/039,162 filed in the USPTO on 19 Aug. 2014.

BACKGROUND OF THE INVENTION

Field of the Invention

The disclosed invention generally relates to a device-holding case construction for encasing and selectively positioning a select electronic device such as a laptop type computer, tablet computer, smart phone or similar other device. More particularly, the disclosed invention provides a device-holding case construction for enabling a user to encase an electronic device and selectively display the electronic device via magnetic attraction(s) intermediate the device-holding panel and case construction portions of the device-holding panel—case construction combination(s).

Brief Description of the Prior Art

Case constructions for use in combination with electronic devices such as tablet type computers and the like are well known in this field of art. While the basic function of a basic case construction is to protect and/or enclose the device it encases, the art continues to develop with an eye toward enhancing functionality of the case constructions so as to provide the user with various means of manipulating and/or re-positioning the devices.

For example, it may be desirable to rotate or reorient the electronic device for different views or positions, while generally supporting the device within or as attached to the basal case construction. When the tablet computer or similar device is supported in its carrying case during use thereof, the multi-function use of the case provides great advantages for utility thereof, while keeping a structure for the improved use to a minimum.

A few of the more pertinent prior art patent-related disclosures relating to cradle-like devices for holding and enabling the re-positioning of the devices they hold are described hereinafter. U.S. Patent Application Publication No. 2006/0187696 ('696 Publication), authored by Lanni, for example, discloses a Cradle for Receiving an Adapter. The '696 Publication describes a cradle casing having a DC/DC adapter to receive DC power from a DC power source and generate a first DC power signal. A sleeve accepts an AC/DC adapter, and guides movement of the AC/DC adapter when the AC/DC adapter is inserted into the cradle casing. The AC/DC adapter is capable of receiving AC power from an AC power source and generating a second DC power signal. A circuit receives at least one of the first DC power signal and the second DC power signal and outputs a third DC power signal.

U.S. Patent Application Publication No. 2008/0002369 ('369 Publication), authored by Carnevali, discloses a Portable Device Docking Station. The '369 Publication describes an external expanding apparatus or "docking station" operable with a portable computer device of a type having a display unit having a display screen on an inner surface thereof and a hard shell backing surface opposite thereof and pivotally mounted on a substantially rigid casing having a pair of locating holes adjacent to opposite corners of a substantially planar bottom surface thereof, and an input/output (I/O) connector positioned on a back plane thereof with a pair of positioning apertures provided on opposite sides thereof.

U.S. Patent Application Publication No. 2011/0261509 ('509 Publication), authored by Xu et al., discloses a Docking Cradle with Floating Connector Assembly. The '509 Publication describes a docking cradle for a portable electronic device that includes a floating connector assembly. The floating connector assembly isolates a portable electronic device connected to the connector assembly from at least some of the shock, vibration or other motion imposed on the rest of the docking cradle.

The connector assembly is positioned above a base frame and comprises a platform, a device interface on the platform, a device securing mechanism connected to the platform and connectable to the portable electronic device to physically secure the portable electronic device to the connector assembly; and at least one connector assembly spring connecting the connector assembly to the base frame such that the connector assembly is movable laterally relative to the base frame.

U.S. Patent Application Publication No. 2012/0075789 ('789 Publication), authored by DeCamp et al., discloses a Swiveling Base for a Portable Computing Device. The '789 Publication describes certain swiveling bases for portable computing devices. A swiveling base according to the '789 Publication includes a base member and a rotatable member. The base member can be placed on a flat surface and rotatably supports the rotatable member. The rotatable member releasably secures the portable computing device and can rotate relative to the base member to reorient a display of the portable computing device.

The swiveling bases may further include a control component disposed on the base member. The control component is disposed on the base member and facilitates user interaction with a computing application being executed on the portable computing device. The control component may be, for example, a button, a joystick, a D-pad, a tactile sensor pad, a touch-sensitive D-pad, a spherical trackball, a slider, or a sliding disk.

U.S. Pat. No. 8,665,044 ('044 patent) and U.S. Pat. No. 8,665,045 ('045 patent), both issued to Lauder et al., respectively disclose a Cover for an Electronic Device and an Accessory Device with Magnetic Attachment. The '044 and '045 patent basically describe a magnetic attachment mechanism and certain associated methods. The magnetic attachment mechanism can be used to releasably attach at least two objects together in a preferred configuration without fasteners and without external intervention. The magnetic attachment mechanism can be used to releasably attach an accessory device to an electronic device. The accessory device can be used to augment the functionality of usefulness of the electronic device.

U.S. Pat. No. 8,672,126 ('126 patent), issued to Rohrback et al., discloses a Foldable Case for Use with an Electronic Device. The '126 patent describes a case for securing and protecting an electronic device. The case can include a cover connected to a pouch by a hinge such that the cover can be overlaid over a device interface. The case can be constructed by layering and combining several types of materials, including for example materials having resistant outer surfaces, materials limiting the deformation of the case, materials providing a soft surface to be placed in contact with the device, and rigid materials for defining a structure of the case. In some embodiments, the case can include a tab that allows a user to fold open the cover of the case to form a triangular prism. The prism can be placed on any of its surfaces such that the device can be oriented towards a user at particular angles.

From a review of the foregoing citations in particular, and from a consideration of the prior art in general, it will be seen that the prior art thus perceives a need for a cradle apparatus usable in combination with a case or cover construction for enabling a user to removably cradle an electronic device as exemplified by a tablet type computer or smart phone and magnetically attach the cradle and cradled electronic device to a case construction in a select orientation selected from the group consisting of a landscape orientation and a portrait orientation as summarized in more detail hereinafter.

SUMMARY OF THE INVENTION

Among the many objectives of this invention is the provision of a device-holding case construction or assembly for selectively displaying or encasing an electronic device such as a notebook, laptop, or tablet type computer, smart phone, or similar other device. These and other readily identifiable objectives of the invention (which other objectives become clear by consideration of the specification, claims and drawings as a whole) are met by providing a combination device-holding panel and case construction that cooperates with an electronic device for selectively displaying or encasing the same.

To achieve these and other readily identifiable objectives, the present invention provides a number of different embodiments of a device-holding case construction for an electronic device having a select feature function operable via a posterior device portion, certain of which device-holding case constructions essentially comprises a device-holding panel for removably retaining a select device, and a case construction for selectively enabling (a) device-holding panel access and (b) device-holding panel encasement.

Certain device-holding panel(s) according to the present invention preferably comprise an anterior device-support portion, a posterior case interface portion, at least one feature-enabling edge, certain device retention means for retaining the select device in anterior adjacency to the anterior device-support portion, and a first magnetically attractive material construction. The at least one feature-enabling edge enables the user to operate the select feature function operable via a posterior device portion when the device retention means retain said select device in anterior adjacency to the anterior device support portion.

Certain case constructions comprise an anterior case portion, a posterior case portion, an anterior-to-posterior junction section, and a second magnetically attractive material construction. The anterior-to-posterior junction section enables the user to pivot the anterior case portion relative to the posterior case portion. The anterior case portion is thus pivotal relative to the posterior case portion via the anterior-to-posterior junction section for selectively (a) uncovering the anterior device-support portion in open case configurations and (b) covering the anterior device-support portion in a closed case configuration. The open case configurations comprise at least one device-display configuration. The first and second magnetically attractive material constructions are magnetically attractive for selectively and magnetically fastening the device-holding panel to the case construction.

In one device-holding panel—case construction combination, the device-holding panel preferably comprises a panel width, a panel length, a distal panel edge, and a proximal panel edge. The posterior case portion of the corresponding case construction preferably comprises a back portion width, a back portion length, a distal posterior panel, a proximal posterior panel, and a distal-to-proximal panel junction section. The proximal posterior panel essentially comprises a proximal posterior case section, and when the proximal panel edge and the proximal posterior case section are aligned, the panel and back portion lengths are substantially uniform, but the panel width is abbreviated relative to the back portion width.

The distal posterior panel is pivotal relative to the proximal posterior panel at the distal-to-proximal panel junction section for selectively (a) overlapping the distal panel edge when in a feature-disabling posterior case portion configuration or (b) exposing the distal panel edge when in a feature-enabling posterior case portion configuration. The exposed distal panel edge provides the at least one feature-enabling edge when the posterior case portion is in the feature-enabling posterior case portion configuration. The distal-to-proximal junction section may be preferably attached to the posterior case interface portion.

In another device-holding panel—case construction combination, the device-holding panel preferably comprises a distal panel portion or landscape pivot section, a lateral panel portion or portrait pivot section, and a medial-proximal panel portion. A select panel portion is pivotal relative the medial-proximal panel portion for selectively (a) disabling the select feature function when in a feature-disabling (planar) device-holding panel configuration and (b) enabling the select feature function when in a feature-enabling (folded) device-holding panel configuration. The select panel portion may be selected from the group consisting of the landscape and portrait pivot sections, and the feature-enabling configuration provides the at least one feature-enabling edge.

In a certain preferred alternative embodiment, the basic invention may be said to alternatively and essentially teach or disclose a device-holding case construction for an electronic device having a select feature function operable via a posterior device portion, in which the device-holding case construction preferably comprises a device-holding panel for removably retaining a select device, and a case construction for selectively enabling (a) device-holding panel access and (b) device-holding panel encasement.

The device-holding panel of the preferred alternative embodiment may be said to comprise an anterior device-support portion, a posterior case interface portion, a landscape feature-enabling portion, a portrait feature-enabling portion, and certain device retention means for retaining the select electronic device in anterior adjacency to the anterior device-support portion. The landscape and portrait feature-enabling portions enable the select feature function when the device retention means retain the select device in anterior adjacency to the anterior device-support portion.

The case construction may be said to comprise an anterior case portion, a posterior case portion, and an anterior-to-posterior junction section, which anterior-to-posterior junction section enables the user to pivot the anterior case portion relative to the posterior case portion. The anterior case portion is pivotal relative to the posterior case portion via the anterior-to-posterior junction section for selectively (a) uncovering the anterior device-support portion in open case configurations, and (b) covering the anterior device-support portion in a closed case configuration.

The device-holding panel may preferably further comprise a first magnetically attractive material construction and the case construction may preferably further comprise a second magnetically attractive material construction. The first magnetically attractive material construction is magnetically attracted to the second magnetically attractive material constructions for selectively and magnetically fastening the corresponding device-holding panel and case construction.

Both the device-holding panel and the case construction of the device-holding panel—case construction combination according to the present invention may further preferably comprise an apertured panel outfitted with apertures. The first and second magnetically attractive material constructions are respectively received in the apertures formed in the apertured panels. The apertures formed in the apertured panels of the device-holding panel and/or case construction may preferably extend entirely through the respective apertured panels for enhancing bidirectional magnetic attractive forces via the apertured panels.

The device-holding panel and/or the case construction may further preferably comprise first and second outer portions or material layers. The first and second outer portions or material layers may be reversible and comprise differing ornamental appearances. The differing ornamental appearances of the reversible first and second outer portions or layers enable the user to selectively display an outer material layer, and the bidirectional magnetic attractive forces enable the user to magnetically fasten the device-holding panel to either of two reversible sides of the case construction.

In certain other alternative embodiments, the basic invention may be said to alternatively and essentially teach or disclose a device-holding case construction for an electronic device, which device-holding case construction essentially comprises a device-holding panel for removably retaining a select device, and a case construction for selectively enabling (a) device-holding panel access and (b) device-holding panel encasement.

The device-holding panel(s) of certain embodiments may be said to preferably comprise an anterior device-support portion, a posterior case interface portion, an upper panel edge, a lower panel edge, and certain device retention means for retaining the select device in anterior adjacency to the anterior device-support portion. The lower panel edge(s) may preferably comprise a first magnetically attractive material construction.

The case construction(s) of certain embodiments may be said to preferably comprise an anterior case portion, a posterior case portion, and an anterior-to-posterior junction section, which anterior-to-posterior junction section enables the user to pivot the anterior case portion relative to the posterior case portion, and which anterior case portion preferably comprises a second magnetically attractive material construction.

The anterior case portion is pivotal relative to the posterior case portion via the anterior-to-posterior junction section for selectively (a) uncovering the anterior device-support portion in open case configurations, and (b) covering the anterior device-support portion in a closed case configuration. The first and second magnetically attractive material constructions are magnetically attractive for magnetically fastening the lower panel edge of the device-holding panel to the anterior case portion of the case construction when in the device-display configuration. Another device-holding case construction may preferably comprise certain device retention means that are off-centered relative to the device-holding panel and centered relative to the posterior case portion when the posterior case portion is in the feature-disabling posterior case portion configuration.

Other objects of the present invention, as well as particular features, elements, and advantages thereof, will be elucidated or become apparent from, the following description and the accompanying drawing figures.

BRIEF DESCRIPTIONS OF THE DRAWINGS

Other features and objectives of my invention will become more evident from a consideration of the following brief descriptions of patent drawings.

Figure 7:
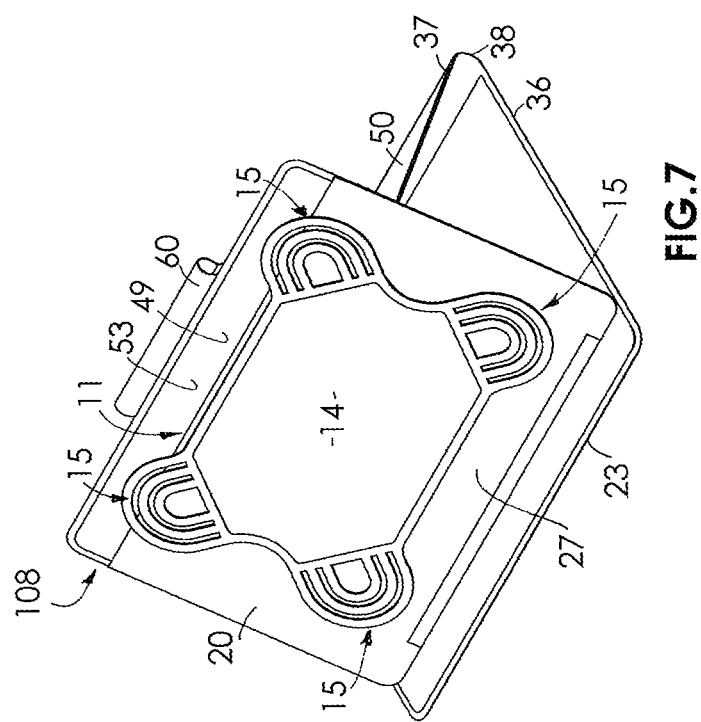

FIG. 7 is a first comparative and relatively enlarged anterior perspective view (comparable to the content of FIG. 8 and enlarged relative to the content of FIG. 5) of the second alternative device-holding panel and case combination or assembly according to the present invention in the first device-display configuration shown with the first exemplary device-retention means outfitted upon the second alternative device-holding panel.

Figure 8:
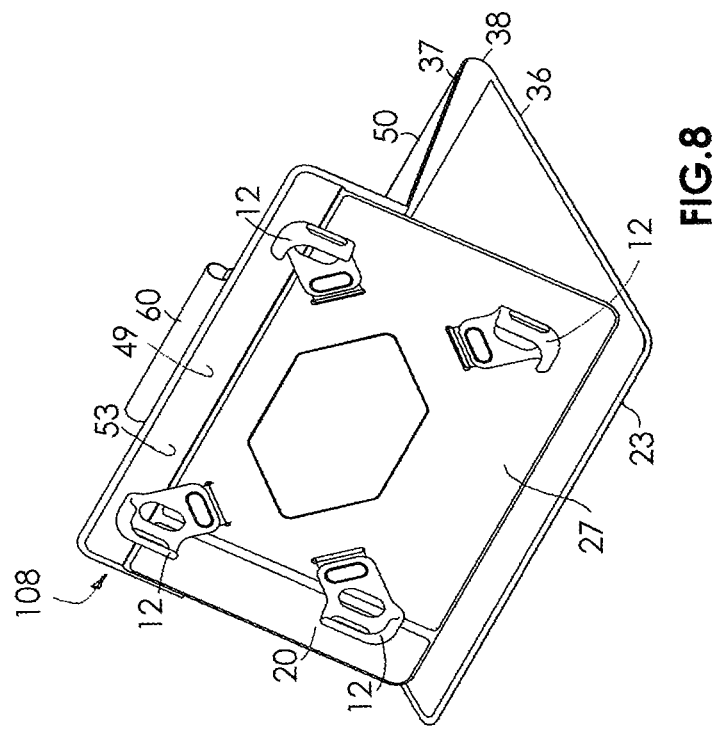

FIG. 8 is a second comparative and relatively enlarged anterior perspective view (comparable to the content of FIG. 7 and enlarged relative to the content of FIG. 5) of the second alternative device-holding panel and case combination or assembly according to the present invention in the first device-display configuration shown with the second exemplary device-retention means outfitted upon the second alternative device-holding panel.

Figure 9:
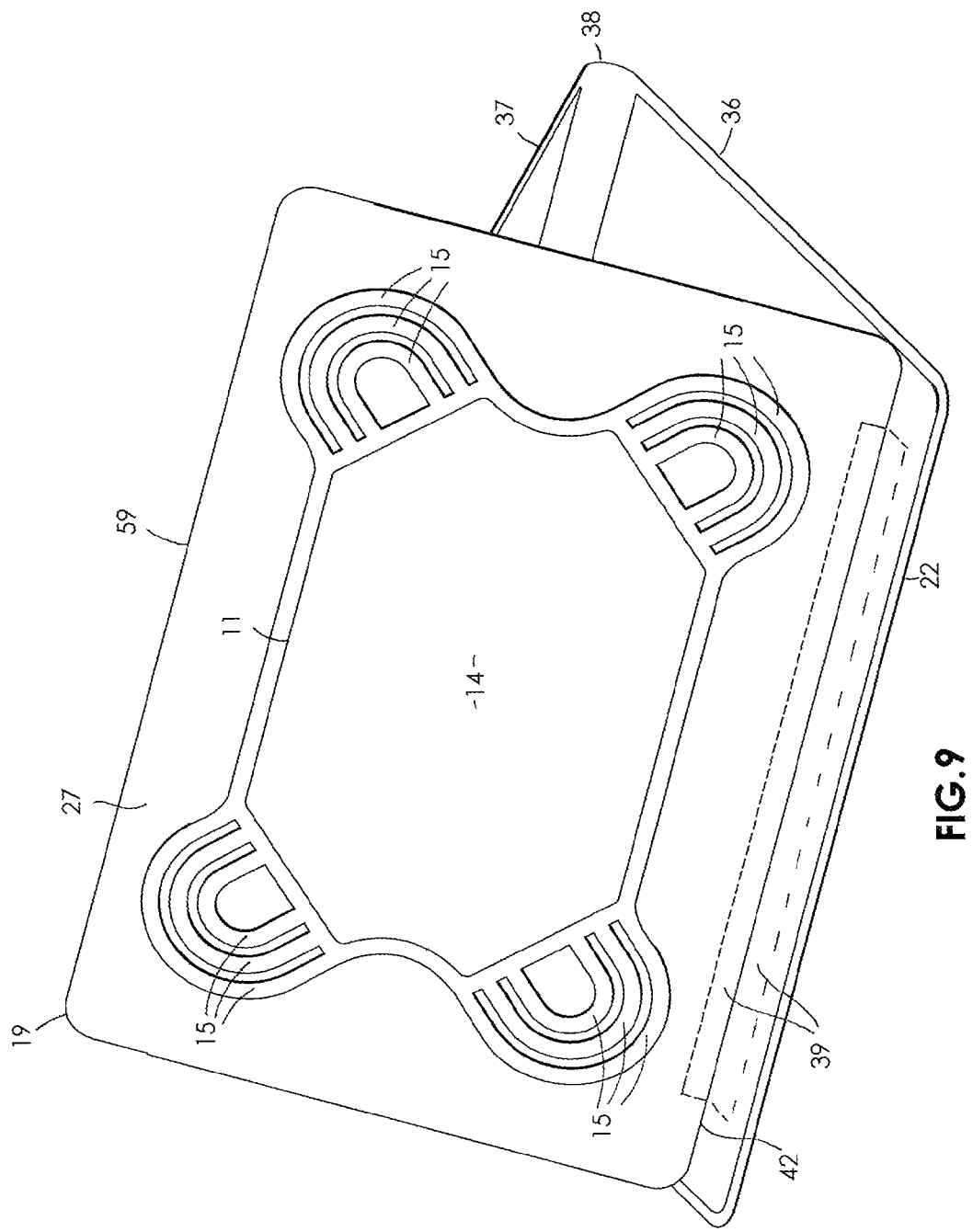

FIG. 9 is an enlarged anterior perspective view of the first alternative device-holding panel and case combination or assembly according to the present invention in the first device-display configuration shown with first exemplary device-retention means outfitted upon the first alternative device-holding panel.

Figure 10:
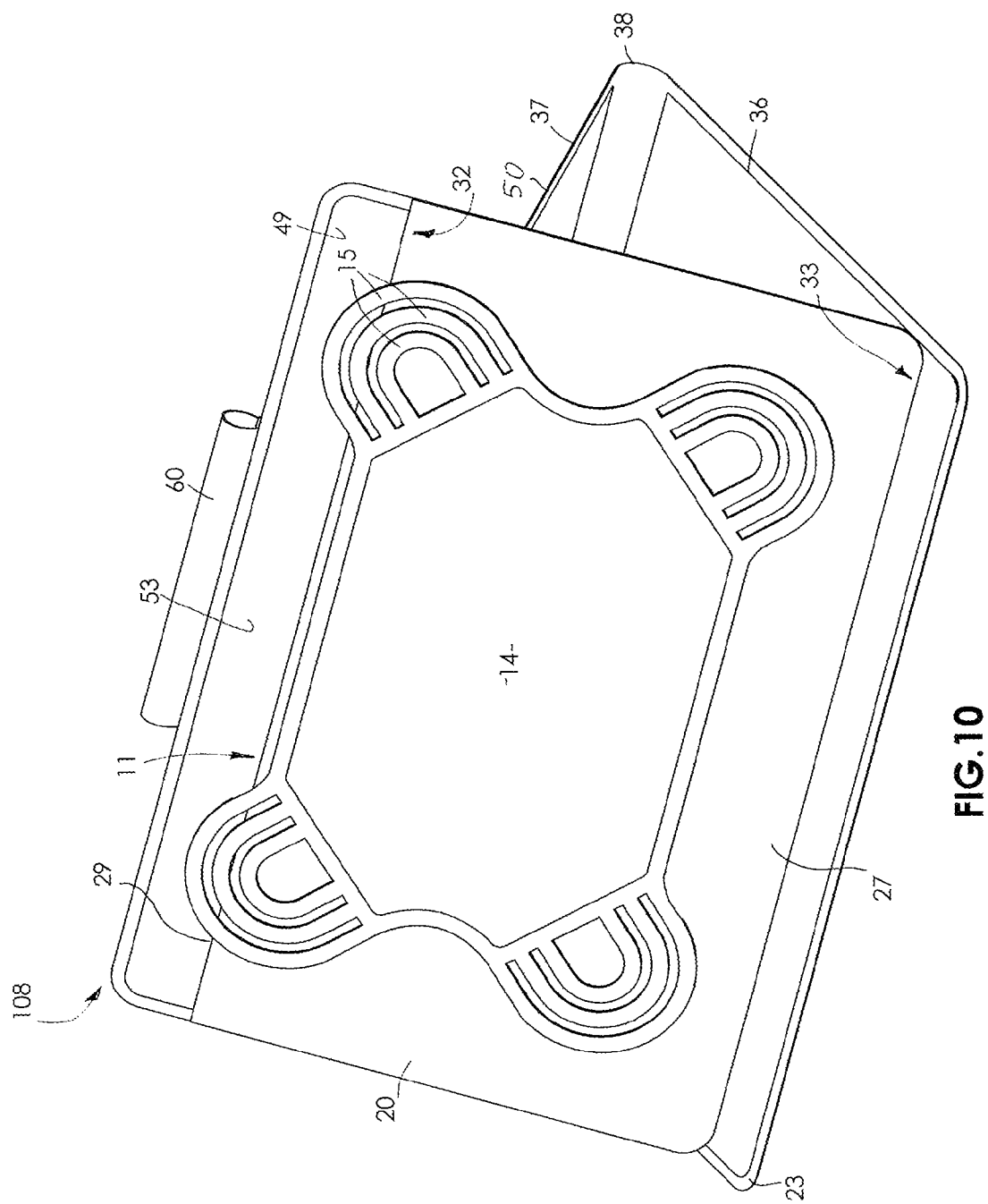

FIG. 10 is an enlarged anterior perspective view of the second alternative device-holding panel and case combination or assembly according to the present invention in the first device-display configuration shown with first exemplary device-retention means outfitted upon the second alternative device-holding panel and without a generic electronic device retained by the first exemplary device-retention means.

Figure 11:
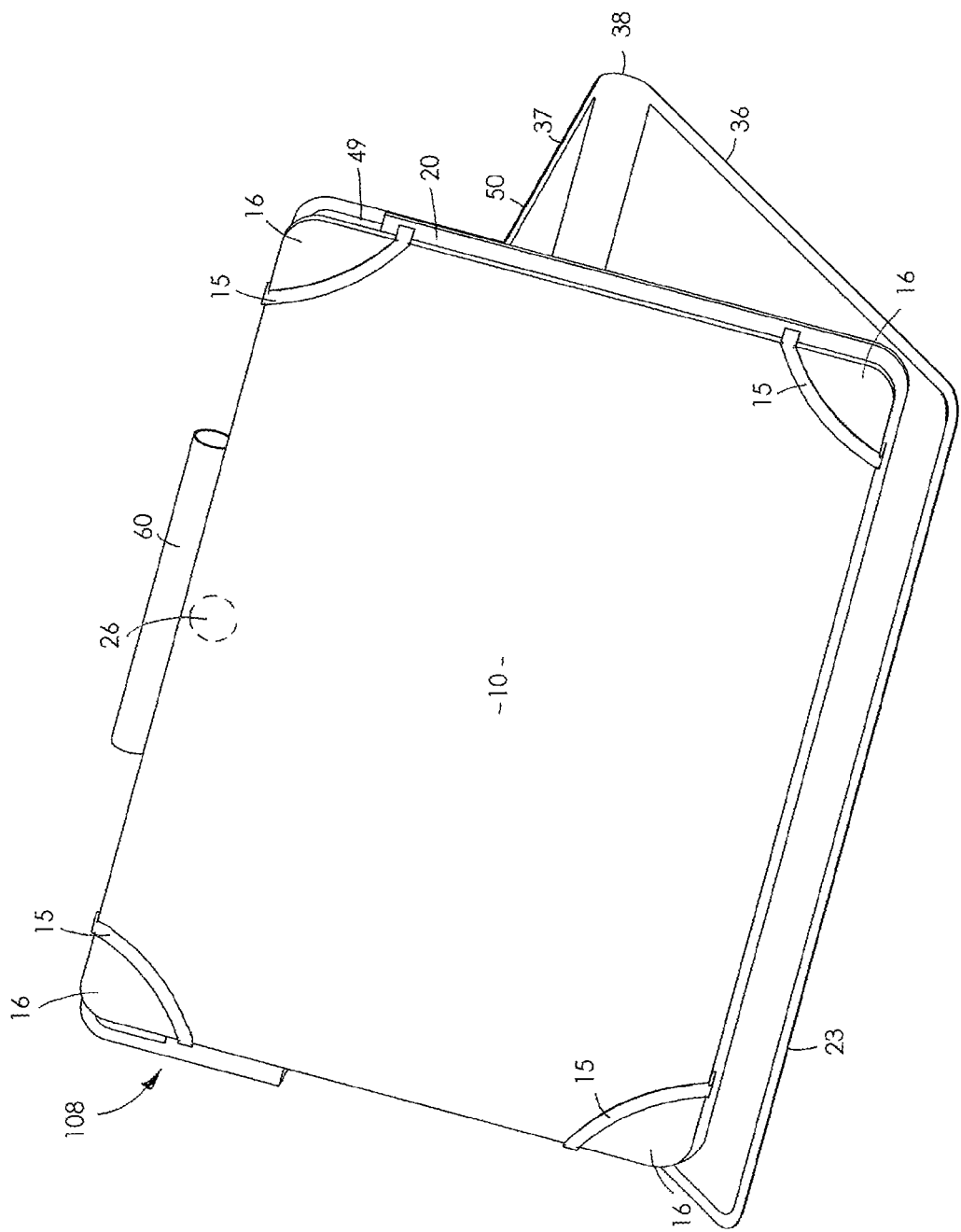

FIG. 11 is an enlarged anterior perspective view of the second alternative device-holding panel and case combination or assembly according to the present invention in the first device-display configuration shown with first exemplary device-retention means outfitted upon the second alternative device-holding panel retaining a generic electronic device.

Figure 12:
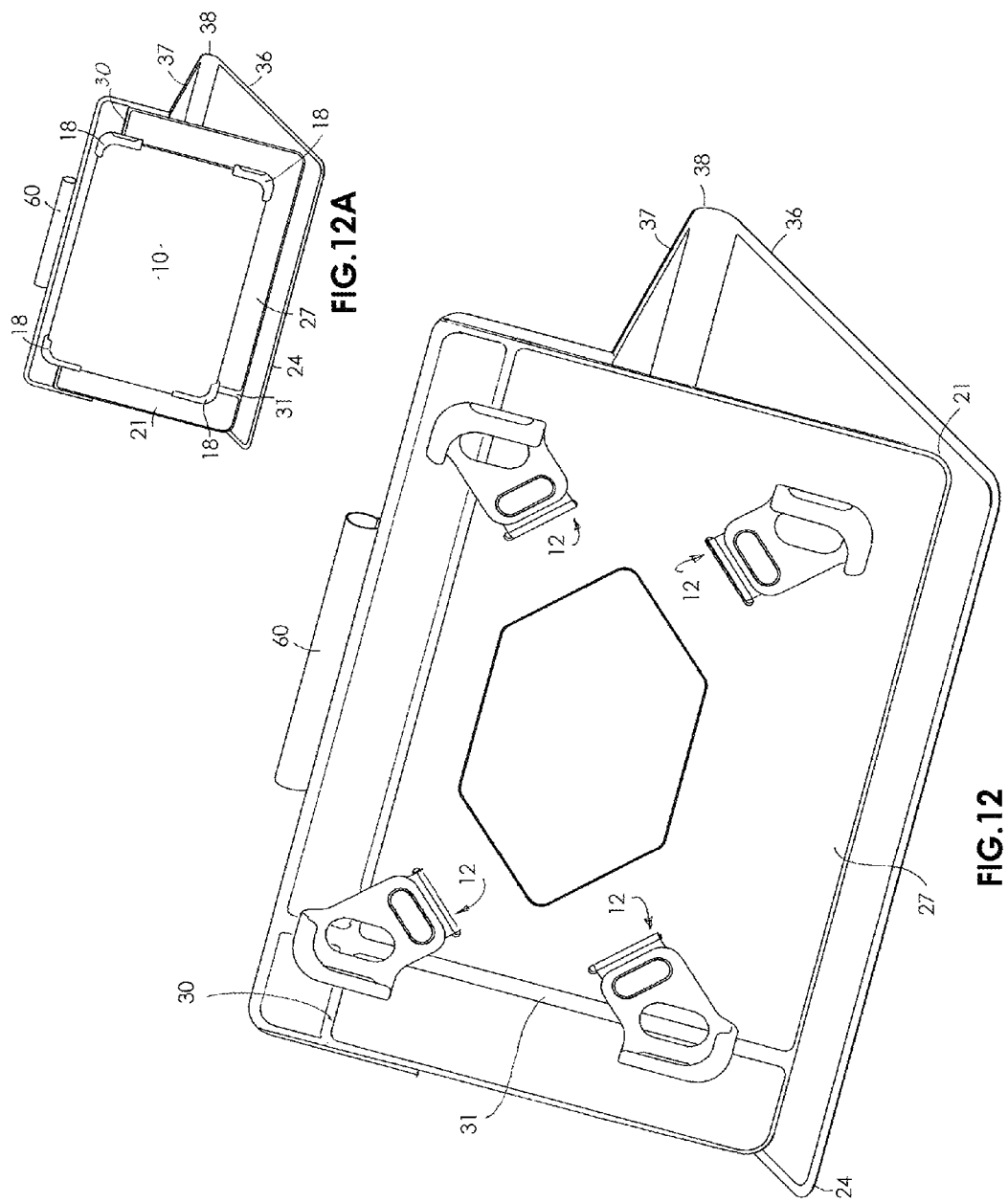

FIG. 12 is an enlarged anterior perspective view of the third alternative device-holding panel and case combination or assembly according to the present invention in the first device-display configuration shown (a) with second exemplary device-retention means outfitted upon the third alternative device-holding panel and (b) without a generic electronic device retained by the second exemplary device-retention means.

FIG. 12A is a reduced anterior perspective view of the third alternative device-holding panel and case combination or assembly according to the present invention in the first device-display configuration shown with second exemplary device-retention means outfitted upon the third alternative device-holding panel retaining a generic electronic device.

Figure 13:
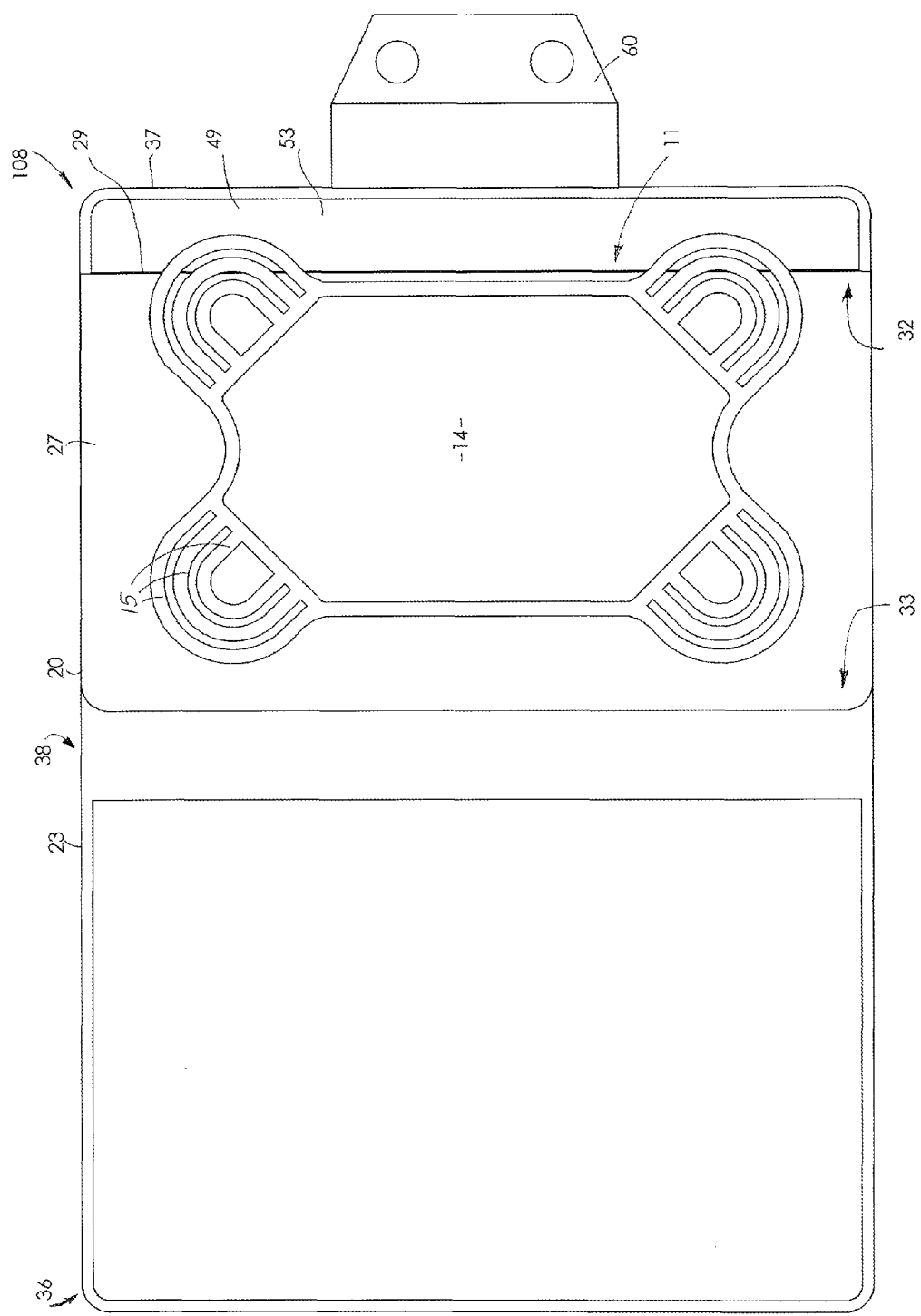

FIG. 13 is an anterior open plan view of the second alternative device-holding panel and case combination or assembly according to the present invention in a second device-display configuration shown with the first exemplary device-retention means outfitted upon the second alternative device-holding panel.

Figure 14:
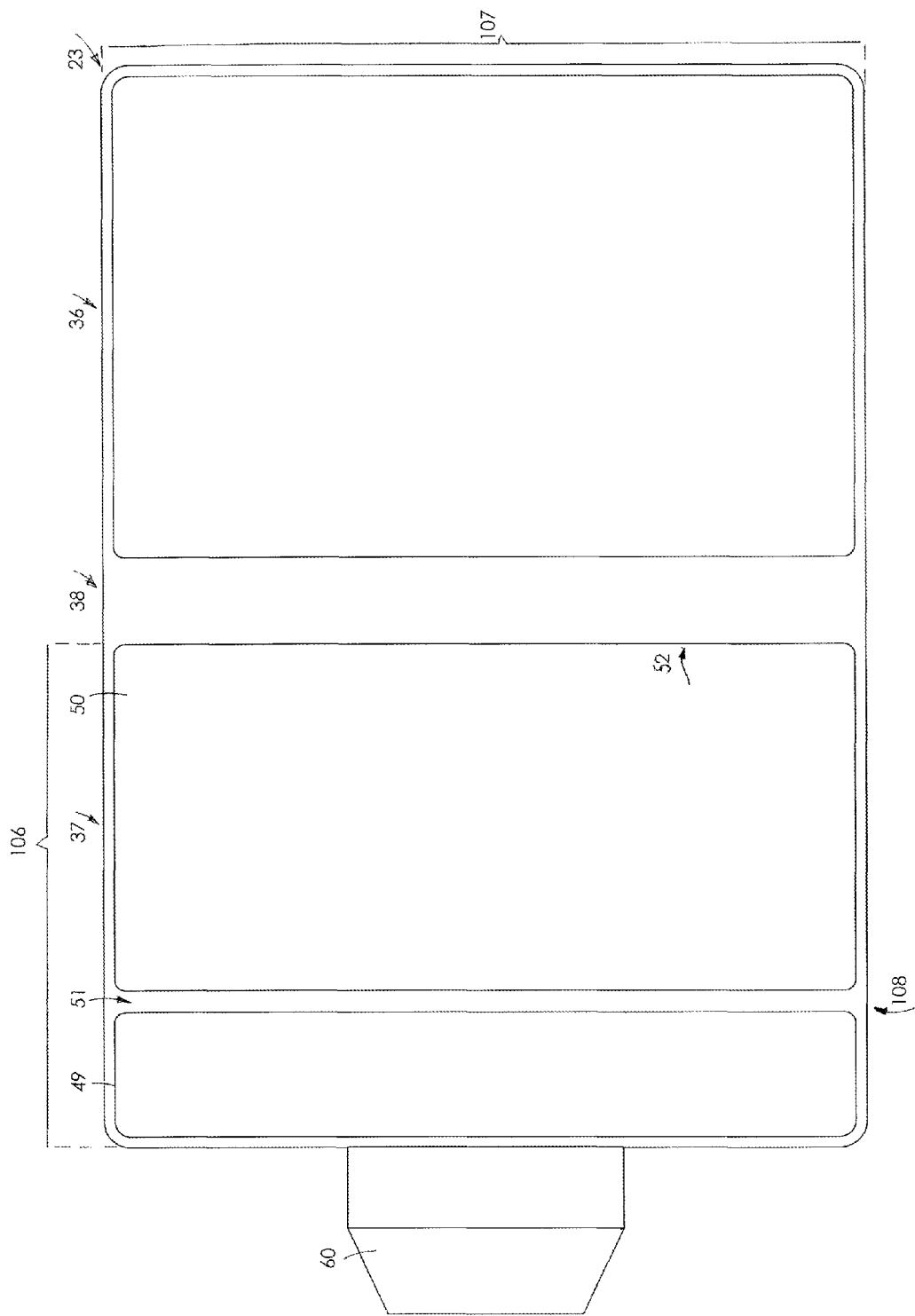

FIG. 14 is a posterior open plan view of the second alternative device-holding panel and case combination or assembly according to the present invention in the second device-display configuration.

FIG. 15 is a first lateral edge view of the second alternative device-holding panel and case combination or assembly according to the present invention in the second device-display configuration, the second alternative device-holding panel being shown in the downward position.

FIG. 15A is an enlarged sectional view of first lateral edge view of the second alternative device-holding panel and case combination or assembly otherwise shown in FIG. 15, enlarged for greater understanding of structural detail therefrom.

FIG. 16 is a second lateral edge view of the second alternative device-holding panel and case combination or assembly according to the present invention in the second device-display configuration, the second alternative device-holding panel being shown in the upward position.

FIG. 16A is an enlarged sectional view of second lateral edge view of the second alternative device-holding panel and case combination or assembly otherwise shown in FIG. 16, enlarged for greater understanding of structural detail therefrom.

Figure 17:
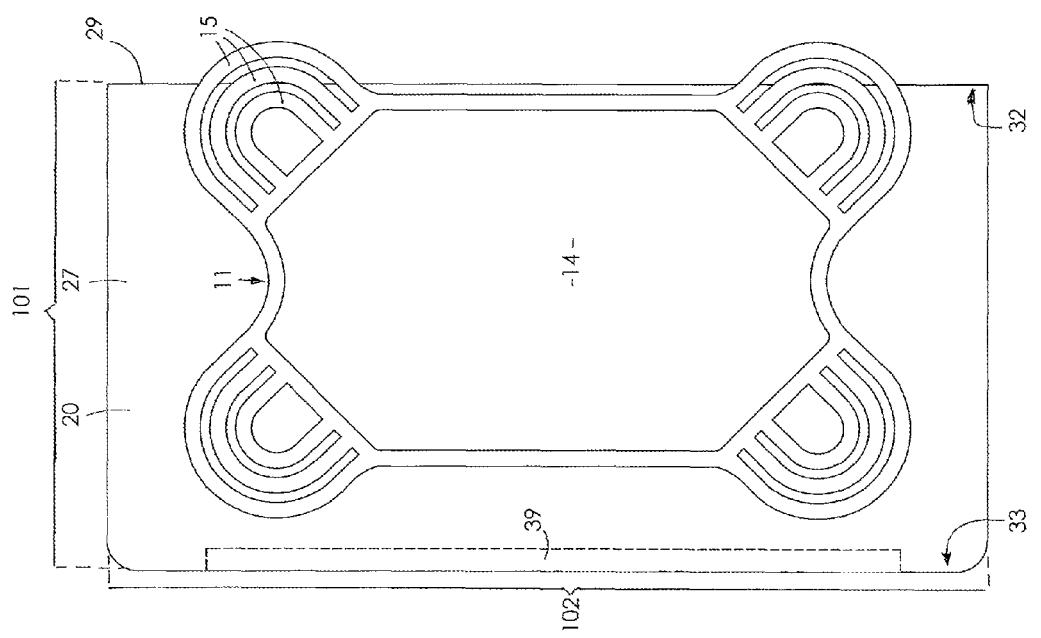

FIG. 17 is an anterior plan view of the second alternative device-holding panel of the second alternative device-holding panel and case combination or assembly according to the present invention with the first exemplary device-retention means outfitted upon the second alternative device-holding panel and otherwise hidden first magnetically attractive material construction depicted in broken lines.

Figure 18:
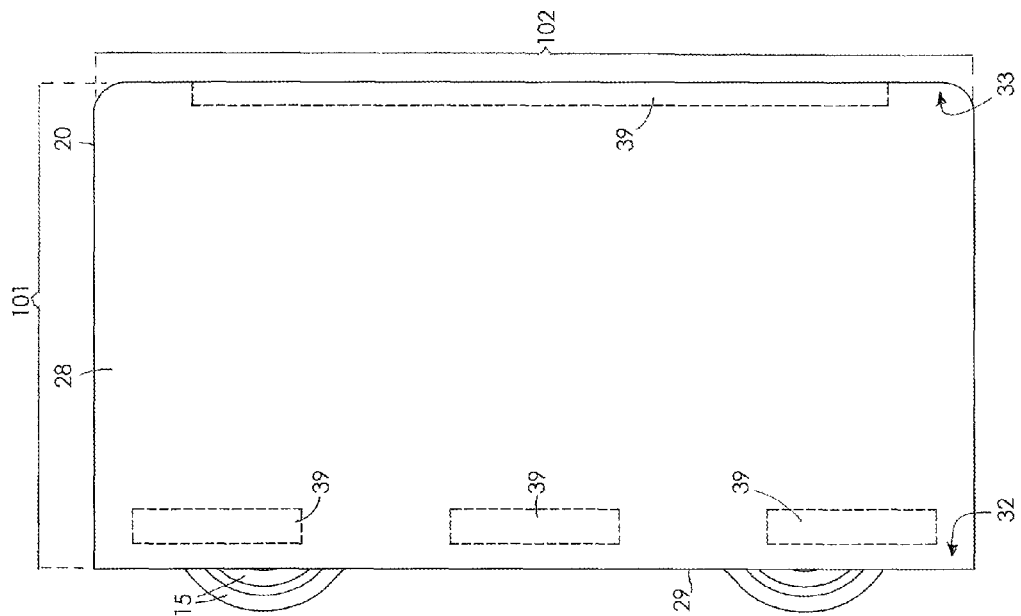

FIG. 18 is a posterior plan view of the second alternative device-holding panel of the second alternative device-holding panel and case combination or assembly according to the present invention with the first exemplary device-retention means outfitted upon the second alternative device-holding panel and otherwise hidden first magnetically attractive material construction depicted in broken lines.

Figure 19:
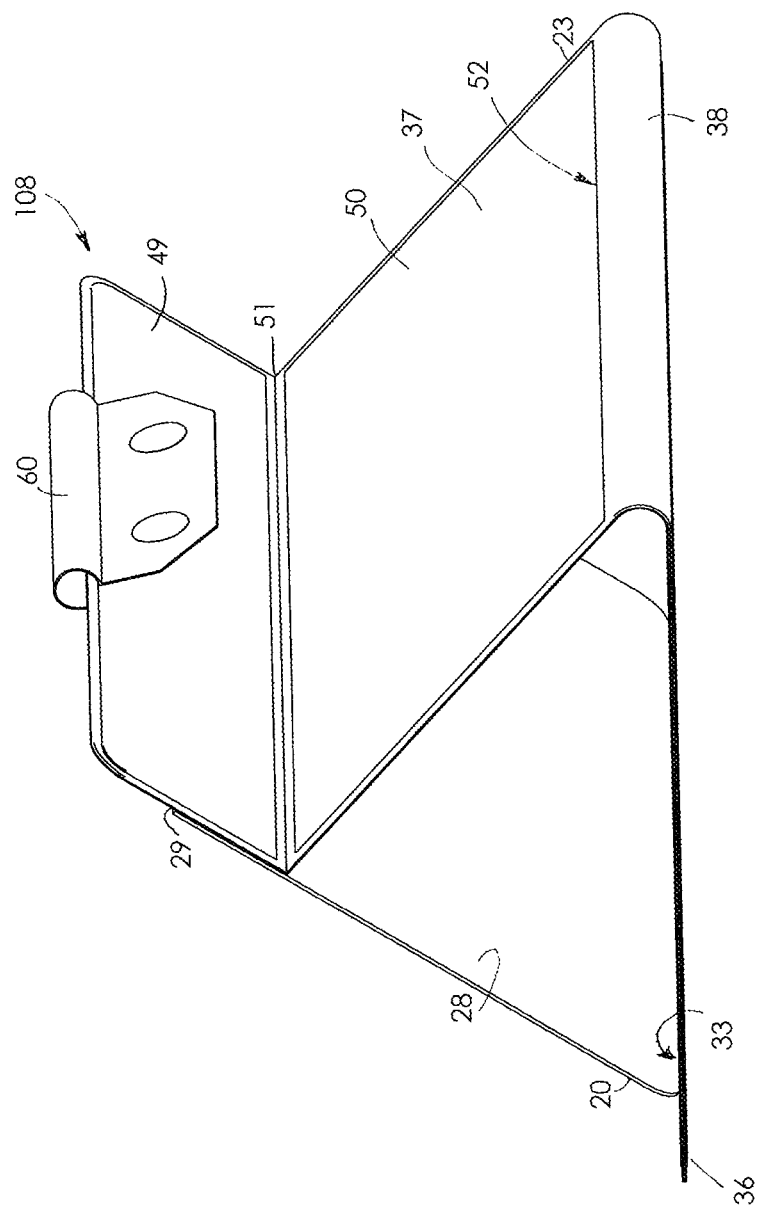

FIG. 19 is a posterior perspective view of the second alternative device-holding panel and case combination or assembly according to the present invention shown in the first device-display configuration.

Figure 20:
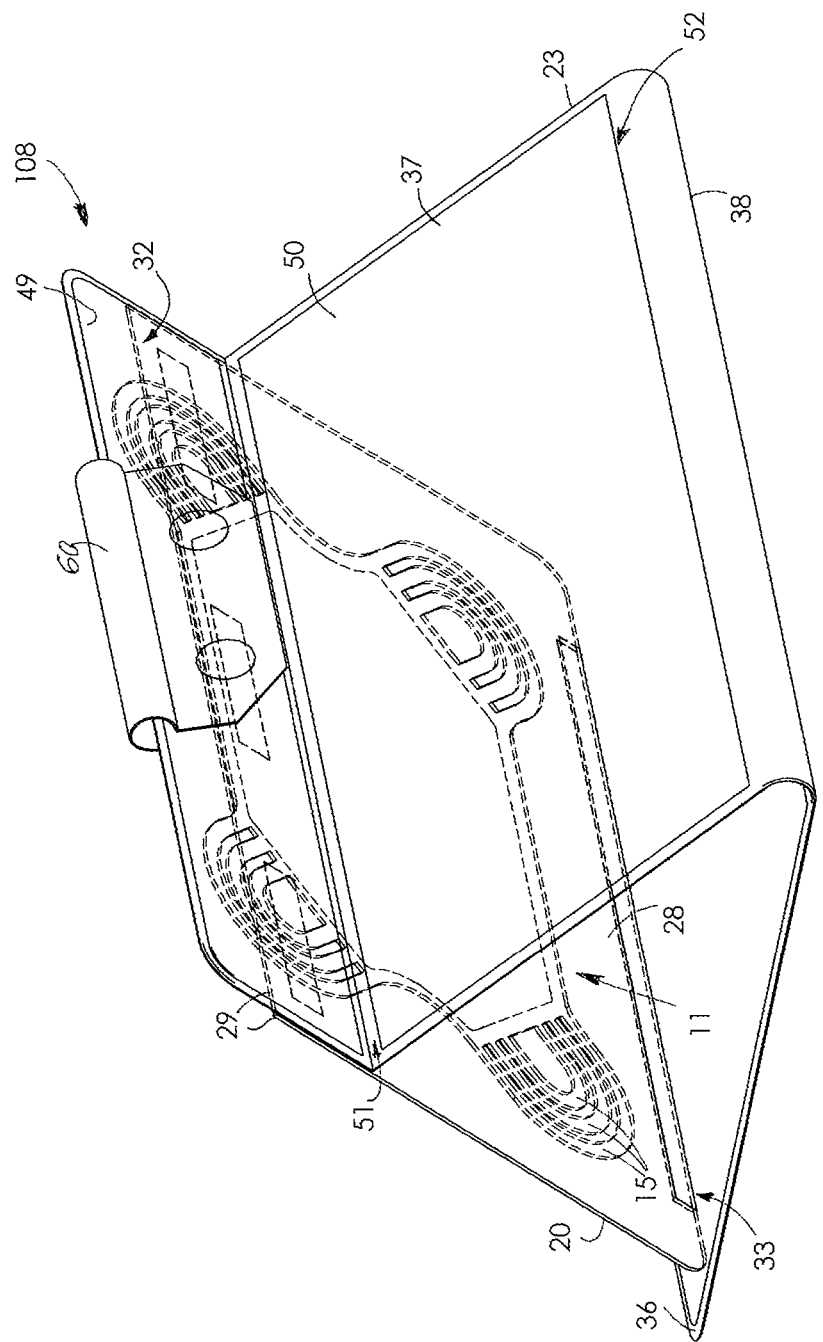

FIG. 20 is a posterior perspective view of the second alternative device-holding panel and case combination or assembly according to the present invention shown in the first device-display configuration with the otherwise hidden first exemplary device-retention means outfitted upon the second alternative device-holding panel depicted in broken lines.

Figure 21:
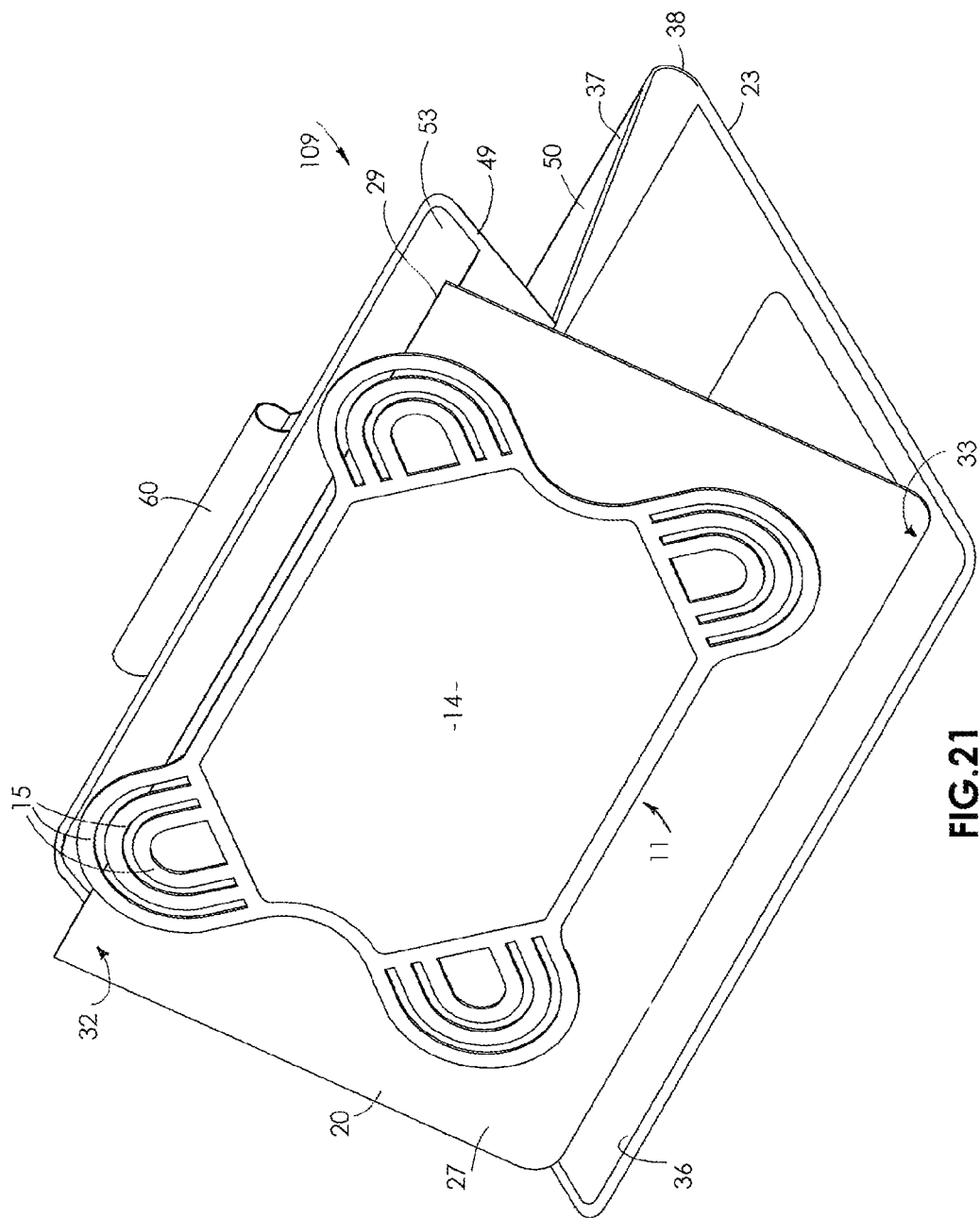

FIG. 21 is a first anterior perspective view of the second alternative device-holding panel and case combination or assembly according to the present invention shown in the first device-display configuration with the first exemplary device-retention means outfitted upon the second alternative device-holding panel and a distal posterior panel of the case construction being shown in a first, feature-enabling, pivoted state relative to a proximal posterior panel of the case construction.

FIG. 22A is a first comparative lateral edge view (comparable to the content of FIG. 22B) of the second alternative device-holding panel and case combination or assembly according to the present invention shown in the first device-display configuration with the first exemplary device-retention means outfitted upon the second alternative device-holding panel retaining a generic electronic device with a posterior device feature function and the distal posterior panel of the case construction being shown in a feature-disabling configuration.

FIG. 22B is a second comparative lateral edge view (comparable to the content of FIG. 22A) of the second alternative device-holding panel and case combination or assembly according to the present invention shown in the first device-display configuration with the first exemplary device-retention means outfitted upon the second alternative device-holding panel retaining a generic electronic device with a posterior device feature function and the distal posterior panel of the case construction being shown in a feature-enabling configuration.

FIG. 23 is a reduced anterior plan view of the second alternative device-holding panel of the second alternative device-holding panel and case combination or assembly according to the present invention with the first exemplary device-retention means outfitted upon the second alternative device-holding panel and otherwise hidden first magnetically attractive material construction depicted in broken lines.

FIG. 24 is a reduced plan view of the second alternative case construction of the second alternative device-holding panel and case combination or assembly according to the present invention and otherwise hidden second magnetically attractive material construction depicted in broken lines.

FIG. 25 is a partially exploded perspective view of the second case construction of the second alternative device-holding panel and case combination or assembly according to the present invention showing from top to bottom a top or outer material layer, a lamination material layer, a series of magnets, an apertured panel assembled to at least a bottom or outer material layer.

FIG. 26 is an enlarged diagrammatic depiction of a section of an apertured panel with magnets received in apertures formed in the apertured panel with lamination material layers in solid lines securing the magnets within the apertures, and lamination layers in broken lines to depict prior movement of the lamination material layers in the direction of the apertured panel.

Figure 27:
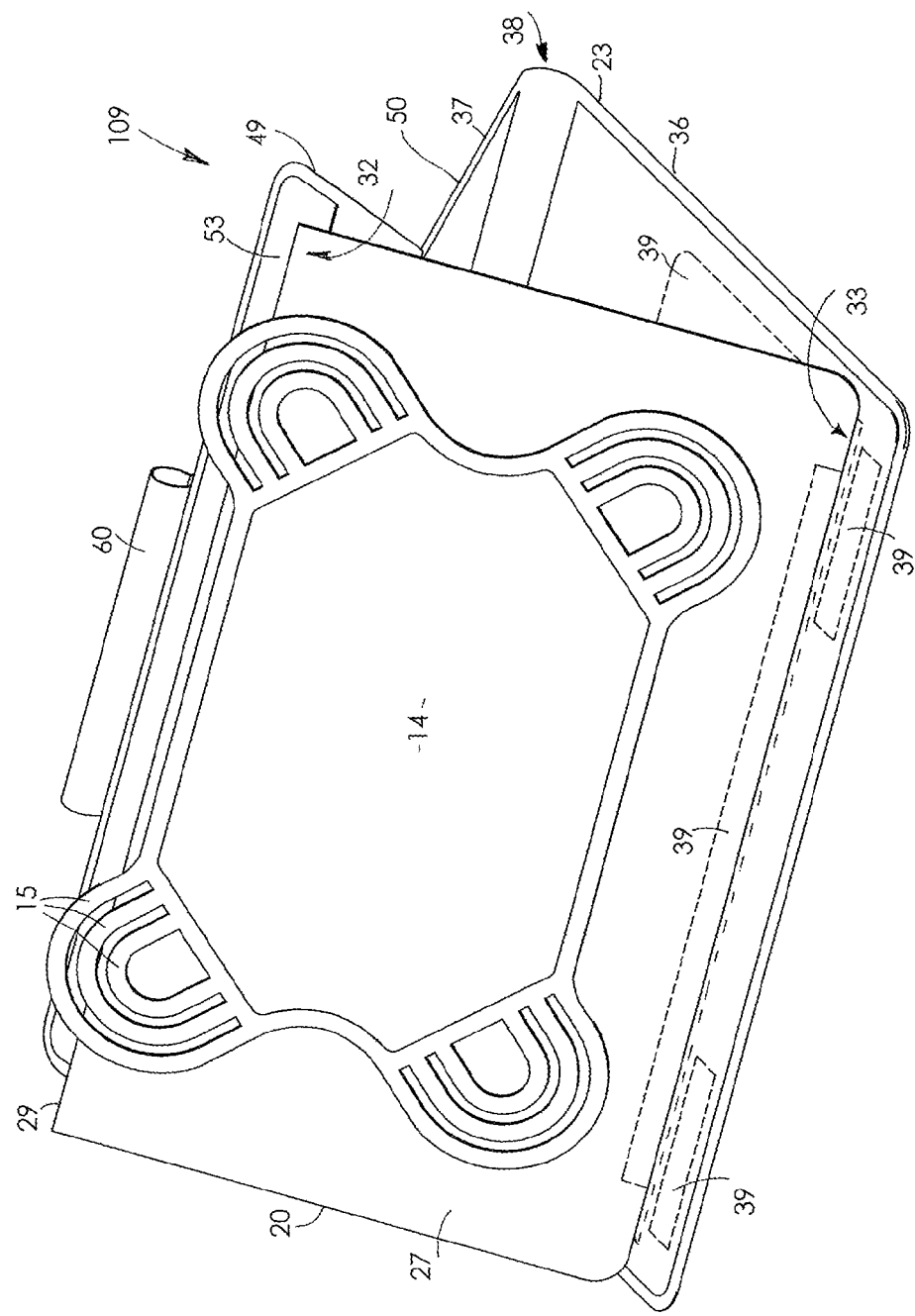

FIG. 27 is a second anterior perspective view of the second alternative device-holding panel and case combination or assembly according to the present invention shown in the first device-display configuration with the first exemplary device-retention means outfitted upon the second alternative device-holding panel and a distal posterior panel of the case construction being shown in the first, feature-enabling, pivoted state relative to a proximal posterior panel of the case construction and otherwise hidden first and second magnetically attractive material construction depicted in broken lines.

FIG. 28 is a second posterior perspective view of the second alternative device-holding panel and case combination or assembly according to the present invention shown in the first device-display configuration with the first exemplary device-retention means outfitted upon the second alternative device-holding panel and a distal posterior panel of the case construction being shown in the first, feature-enabling, pivoted state relative to a proximal posterior panel of the case construction and otherwise hidden first and second magnetically attractive material construction depicted in broken lines.

FIG. 29A is a first comparative reduced anterior perspective view of the second alternative device-holding panel and case combination or assembly according to the present invention (comparable to the content of FIG. 29B) in the first device-display configuration shown with the distal posterior panel of the case construction in the feature-disabling configuration.

FIG. 29B is a second comparative reduced anterior perspective view of the second alternative device-holding panel and case combination or assembly according to the present invention (comparable to the content of FIG. 29A) in the first device-display configuration shown with the distal posterior panel of the case construction in the first pivoted, feature-enabling configuration.

FIG. 30A is a third comparative reduced anterior perspective view of the second alternative device-holding panel and case combination or assembly according to the present invention (comparable to the content of FIG. 30B) in the first device-display configuration shown with the distal posterior panel of the case construction in the feature-disabling configuration.

FIG. 30B is a fourth comparative reduced anterior perspective view of the second alternative device-holding panel and case combination or assembly according to the present invention (comparable to the content of FIG. 30A) in the first device-display configuration shown with the distal posterior panel of the case construction in the first pivoted, feature-enabling configuration.

FIG. 31 is a first closed plan view of the third alternative device-holding panel and case combination or assembly according to the present invention showing posterior surfacing of an anterior case portion of the third alternative case construction.

FIG. 32 is a second closed plan view of the third alternative device-holding panel and case combination or assembly according to the present invention showing posterior surfacing of a posterior case portion of the third alternative case construction.

Figure 33:
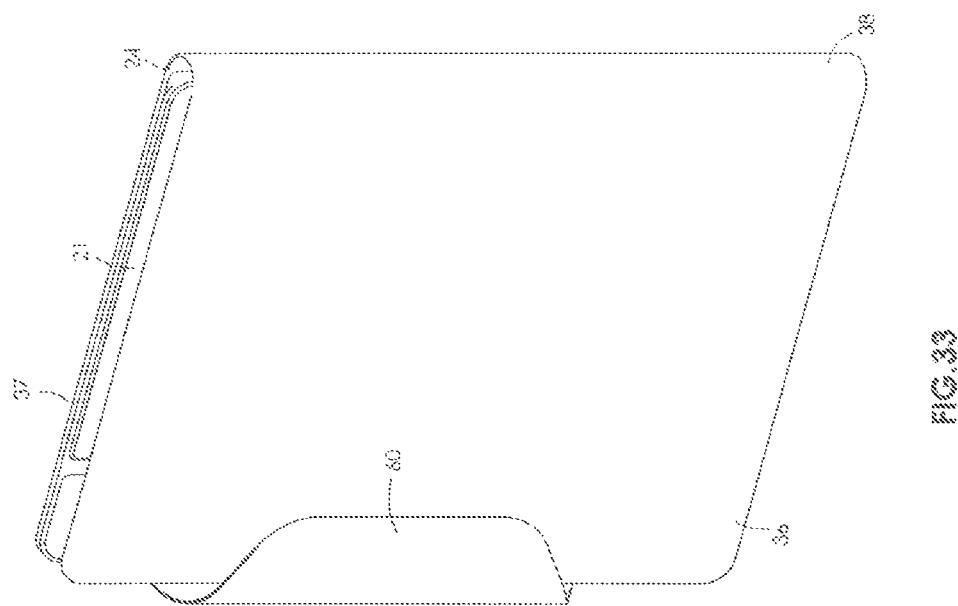

FIG. 33 is a first perspective view of the third alternative device-holding panel and case combination or assembly according to the present invention in a closed case configuration showing posterior surfacing of an anterior case portion of the third alternative case construction.

Figure 34:
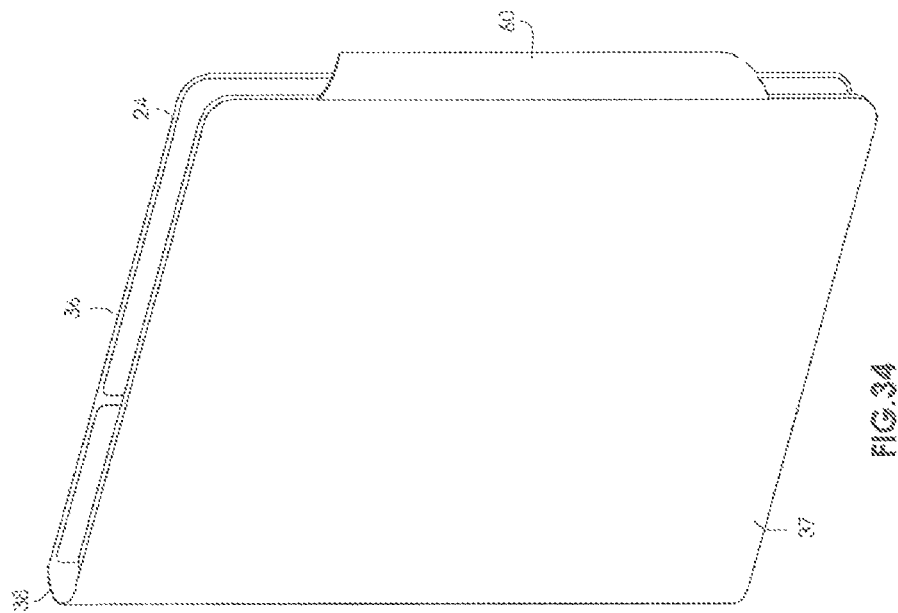

FIG. 34 is a second perspective view of the third alternative device-holding panel and case combination or assembly according to the present invention in a closed case configuration showing posterior surfacing of a posterior case portion of the third alternative case construction.

FIG. 35A is a first lateral edge view of the third alternative device-holding panel and case combination or assembly according to the present invention in a closed case configuration, the third alternative device-holding panel being shown in the upward position.

FIG. 35B is a second lateral edge view of the third alternative device-holding panel and case combination or assembly according to the present invention in the closed case configuration, the third alternative device-holding panel being shown in the downward position.

FIG. 35C is a front edge view of the third alternative device-holding panel and case combination or assembly according to the present invention in the closed case configuration, the third alternative device-holding panel being shown in the downward position.

FIG. 35D is a rear edge view of the third alternative device-holding panel and case combination or assembly according to the present invention in the closed case configuration, the third alternative device-holding panel being shown in the downward position.

FIG. 36 is a first assembled anterior perspective view of the third alternative device-holding panel and case combination or assembly according to the present invention in an open, first device-display case configuration.

FIG. 37 is a first exploded anterior perspective view of the third alternative device-holding panel and case combination or assembly according to the present invention.

FIG. 38A is a reduced first comparative exploded anterior perspective view of the third alternative device-holding panel and case combination or assembly according to the present invention (comparable to the content of FIG. 38B) showing a first outer material layer of the third alternative case construction.

FIG. 38B is a reduced second comparative exploded anterior perspective view of the third alternative device-holding panel and case combination or assembly according to the present invention (comparable to the content of FIG. 38A) showing a second outer material layer of the third alternative case construction.

FIG. 39 is an anterior perspective view of the third alternative device-holding panel and case combination or assembly according to the present invention in a portrait type device-display configuration shown with the second exemplary device-retention means outfitted upon the third alternative device-holding panel.

FIG. 39A is a reduced anterior perspective view of the third alternative device-holding panel and case combination or assembly according to the present invention in a landscape type device-display configuration shown with the second exemplary device-retention means outfitted upon the third alternative device-holding panel.

FIG. 40 is a first comparative lateral edge view of the third alternative device-holding panel in a portrait type orientation (comparable to the content of FIG. 41) outfitted with the second exemplary device-retention means retaining a generic electronic device with a portrait pivot section of the third alternative device-holding panel in a feature-disabling configuration.

FIG. 41 is a second comparative lateral edge view of the third alternative device-holding panel in a portrait type orientation (comparable to the content of FIG. 40) outfitted with the second exemplary device-retention means retaining a generic electronic device with a portrait pivot section of the third alternative device-holding panel in a feature-enabling configuration.

FIG. 42 is a first lateral edge view of the third alternative device-holding panel in a portrait type orientation with the second exemplary device-retention means removed and the portrait pivot section of the third alternative device-holding panel in a downward, feature-disabling configuration.

FIG. 43 is a first anterior plan view of the third alternative device-holding panel in a portrait type orientation with the second exemplary device-retention means removed and the portrait and landscape pivot sections of the third alternative device-holding panel in feature-disabling configurations.

FIG. 44 is a first posterior plan view of the third alternative device-holding panel in a portrait type orientation and the portrait and landscape pivot sections of the third alternative device-holding panel in feature-disabling configurations.

FIG. 45 is a second lateral edge view of the third alternative device-holding panel in a portrait type orientation with the second exemplary device-retention means removed and the portrait pivot section of the third alternative device-holding panel in a downward, feature-disabling configuration with an otherwise hidden first magnetically attractive material construction being depicted in broken lines.

FIG. 46 is a second anterior plan view of the third alternative device-holding panel in a portrait type orientation with the second exemplary device-retention means removed and the portrait and landscape pivot sections of the third alternative device-holding panel in feature-disabling configurations with an otherwise hidden first magnetically attractive material construction being depicted in broken lines.

FIG. 47 is a second posterior plan view of the third alternative device-holding panel in a portrait type orientation and the portrait and landscape pivot sections of the third alternative device-holding panel in feature-disabling configurations with an otherwise hidden first magnetically attractive material construction being depicted in broken lines.

FIG. 48 is a first lateral edge view of the third alternative device-holding panel in a portrait type orientation outfitted with the second exemplary device-retention means and the landscape pivot section of the third alternative device-holding panel in a feature-enabling configuration.

FIG. 49 is a first anterior plan view of the third alternative device-holding panel in a portrait type orientation outfitted with the second exemplary device-retention means and the landscape pivot section of the third alternative device-holding panel in the feature-enabling configuration.

FIG. 50 is a first posterior plan view of the third alternative device-holding panel in a portrait type orientation and the landscape pivot section of the third alternative device-holding panel in the feature-enabling configuration depicting a landscape edge of a generic electronic device with a posterior device feature.

Figure 51:
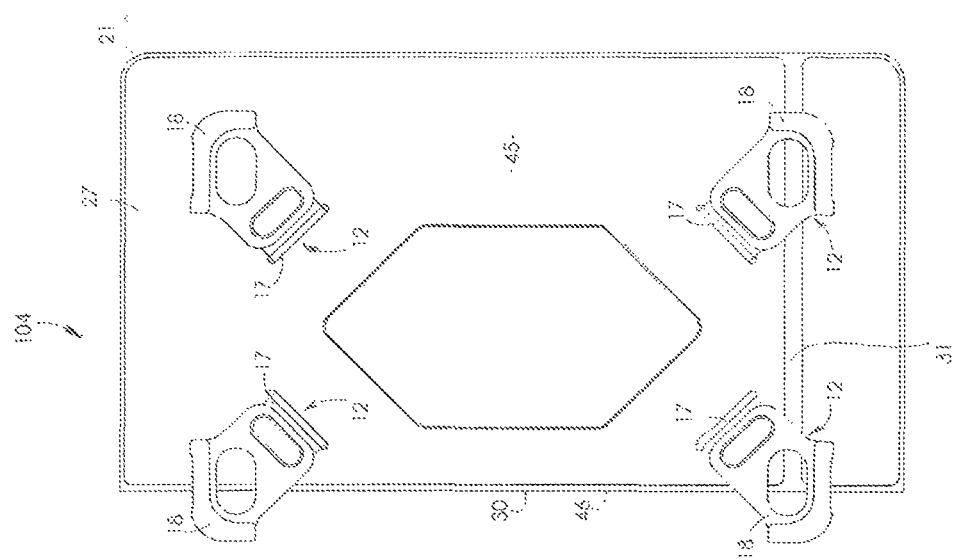

FIG. 51 is a second anterior plan view of the third alternative device-holding panel in a portrait type orientation outfitted with the second exemplary device-retention means and the landscape pivot section of the third alternative device-holding panel in the feature-enabling configuration.

Figure 52:
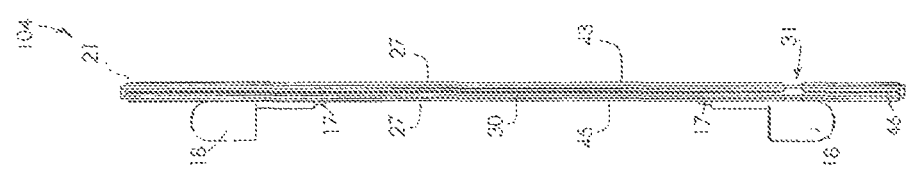

FIG. 52 is a second lateral edge view of the third alternative device-holding panel in a portrait type orientation outfitted with the second exemplary device-retention means and the landscape pivot section of the third alternative device-holding panel in a feature-enabling configuration.

Figure 53:
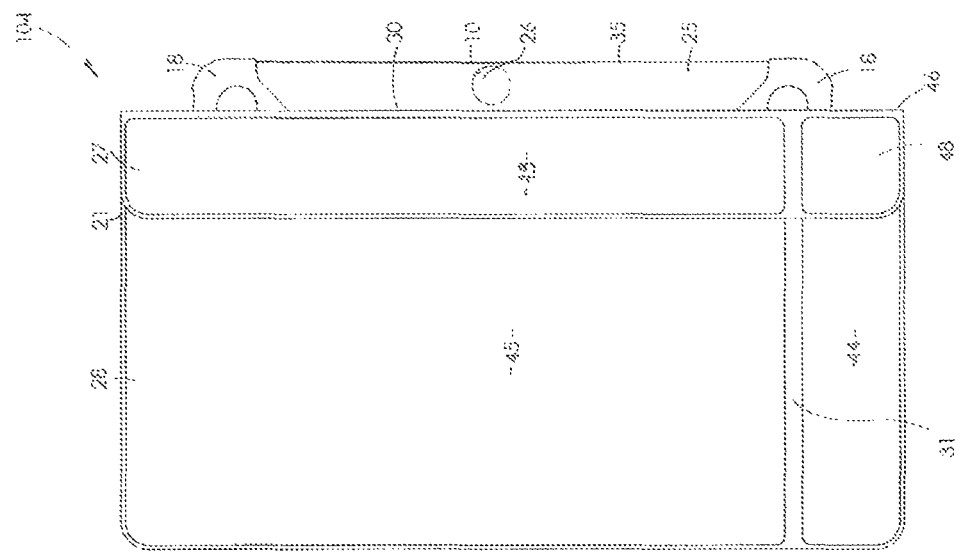

FIG. 53 is a second posterior plan view of the third alternative device-holding panel in a portrait type orientation and the landscape pivot section of the third alternative device-holding panel in the feature-enabling configuration depicting a landscape edge of a generic electronic device with a posterior device feature.

FIG. 54 is a first anterior plan view of the third alternative device-holding panel in a portrait type orientation outfitted with the second exemplary device-retention means and the portrait pivot section of the third alternative device-holding panel in the feature-enabling configuration.

FIG. 55 is a first lateral edge view of the third alternative device-holding panel in a portrait type orientation outfitted with the second exemplary device-retention means and the portrait pivot section of the third alternative device-holding panel in a feature-enabling configuration.

FIG. 56 is a first posterior plan view of the third alternative device-holding panel in a portrait type orientation and the portrait pivot section of the third alternative device-holding panel in the feature-enabling configuration depicting a portrait edge of a generic electronic device with a posterior device feature.

FIG. 57 is an open plan view of the third alternative case construction of the third alternative device-holding panel-case combination or assembly according to the present invention with an otherwise hidden second magnetically attractive material construction being depicted in broken lines.

FIG. 58 is an exploded perspective view of the third alternative device-holding panel-case combination or assembly according to the present invention with an otherwise hidden second magnetically attractive material construction being depicted in broken lines.

Figure 59:
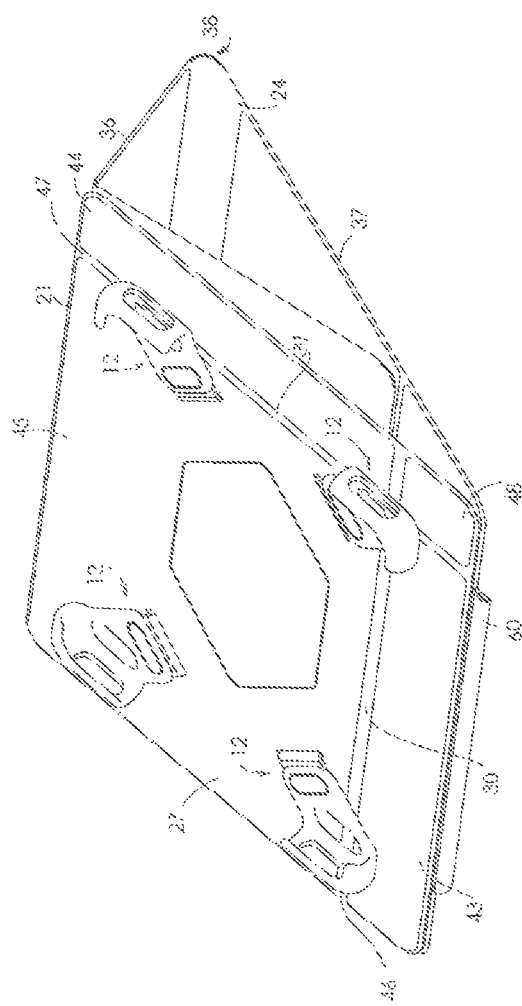

FIG. 59 is a top anterior perspective view of the third alternative device-holding panel-case combination or assembly according to the present invention showing the device-holding panel in a landscape orientation in a third device-display configuration.

FIG. 60 is a bottom posterior perspective view of the third alternative device-holding panel-case combination or assembly according to the present invention showing the device-holding panel in the landscape orientation in the third device-display configuration.

DETAILED DESCRIPTION OF THE PREFERRED EMBODIMENTS

Referring now to the drawings with more specificity, the present invention preferably provides a device-holding case construction, as variously embodied, for encasing a select electronic device such as a smart phone, tablet computer, personal digital assistant, or similar other device as generically depicted and referenced at generic device 10. The device-holding case construction(s) according to the present invention each preferably comprise certain device retention means for either retaining a uniquely sized and shaped electronic device or device retention means for retaining variously sized select devices thereby rendering the device-holding case construction a universal device-holding case construction.

The universal device-holding case construction(s) according to the present invention may thus preferably comprise certain universal device retention means that are exemplified by either a unibody, polymeric device-engaging construction 11 as generally depicted and referenced in FIGS. 4, 5, 7, 9, 10, 11, 13, 17, 18, 20, 21, 23, 27, 28, and 29A-30B; or a series of strap—hook assemblies 12 as generally depicted and/or referenced in FIGS. 6, 8, 12, 12A, 35A-35C, 36-41, 48-56, and 59. In both exemplary embodiments, the universal device retention means may be defined by incorporating a series of elastic constructions that are elastically actuable for engaging variously sized select devices so as to secure the same to the anterior device-support portion(s) 13 of the device holding panel constructions according to the present invention.

The device-engaging construction 11 comprises a central polymeric portion as at 14, and corner-based series of elastic band or strap elements as at 15. Comparatively referencing FIG. 10 versus FIG. 11, the reader will there see that the band or strap elements 15 may be elastically actuated to overlap and secure the corner regions 16 of the target or select electronic device 10. The strap-hook assemblies 12, by contrast, each comprises an elastic strap or body as at 17 and a fixed or molded hook construction as at 18. The hook constructions receive corner regions 16 of the target device 10, and the elastic straps or bodies 17 are actuated sufficiently such that the hook constructions 18 receive and secure the corner regions 16.

Figure 4:
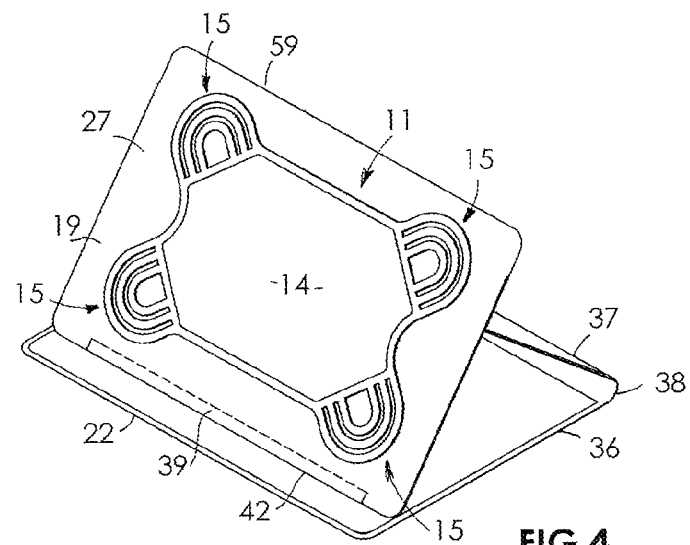
FIG. 4 is a reduced anterior perspective view of the first alternative device-holding panel and case combination or assembly according to the present invention in the first device-display configuration shown with the first exemplary device-retention means outfitted upon the first alternative device-holding panel.
Figure 5:
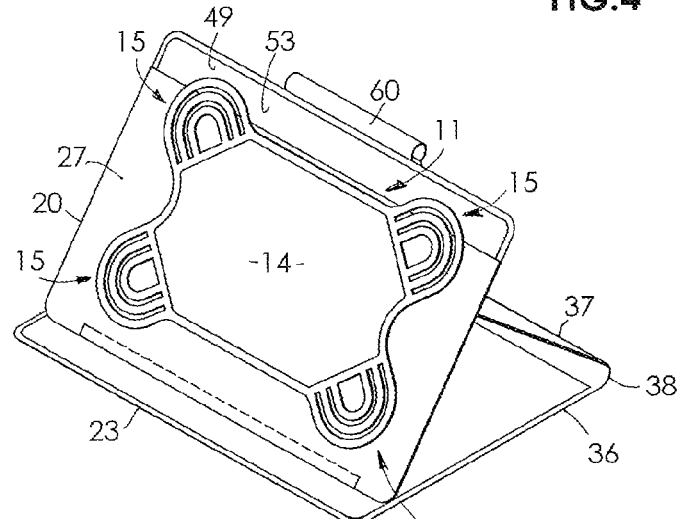
FIG. 5 is a reduced anterior perspective view of the second alternative device-holding panel and case combination or assembly according to the present invention in the first device-display configuration shown with the first exemplary device-retention means outfitted upon the second alternative device-holding panel.
Figure 6:
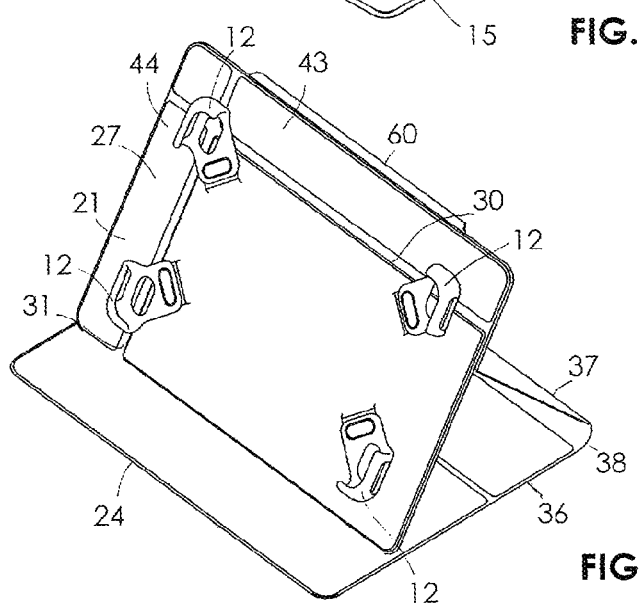
FIG. 6 is a reduced anterior perspective view of the third alternative device-holding panel and case combination or assembly according to the present invention in the first device-display configuration shown with the second exemplary device-retention means outfitted upon the third alternative device-holding panel.

Referencing FIGS. 1-3, the reader will there see three alternative device-holding case construction embodiments of the device-holding construction according to the present invention presented without any device-retention means as exemplified hereinabove. FIGS. 4 and 5 introduce the polymeric device-engaging construction 11 in combination with the first two alternative embodiments generally depicted in FIGS. 1 and 2. FIG. 6 introduces the series of strap-hook assemblies 12 in combination with the third alternative embodiment otherwise depicted in FIG. 3.

The device retention means according to the present invention as exemplified by the two forms discussed hereinabove are presented as such so as to illustrate that the device retention means may be interchanged and are not meant to be limiting. Any number of device retention means could conceivably be utilized in combination with the other key aspects of the invention as described in more detail hereinafter and still be embraced by the spirit and scope of the present inventive concepts.

All of the embodiments discussed in the present application preferably comprise a device-holding panel and a case construction, and any number of device-retention means may be cooperably associated with the device-holding panel(s) for retaining the select or target electronic device 10 in anterior adjacency to the anterior device-support portion of the device-holding panel.

Figure 1:
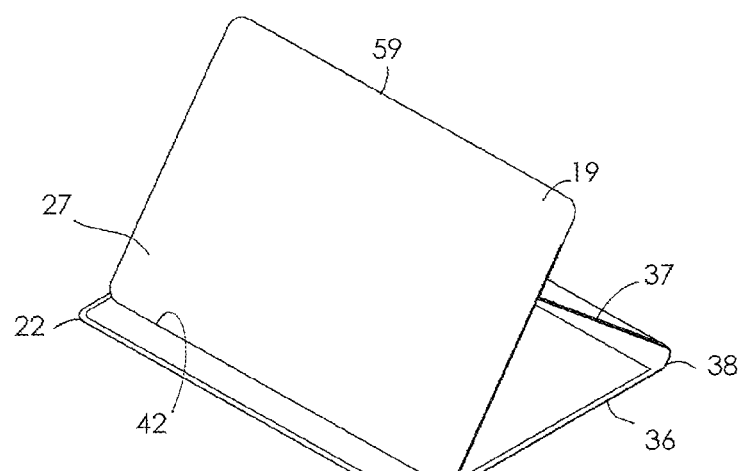
FIG. 1 is a reduced anterior perspective view of a first alternative device-holding panel and case combination or assembly according to the present invention in a first device-display configuration shown with certain device-retention means removed to highlight the first alternative device-holding panel.
Figure 2:
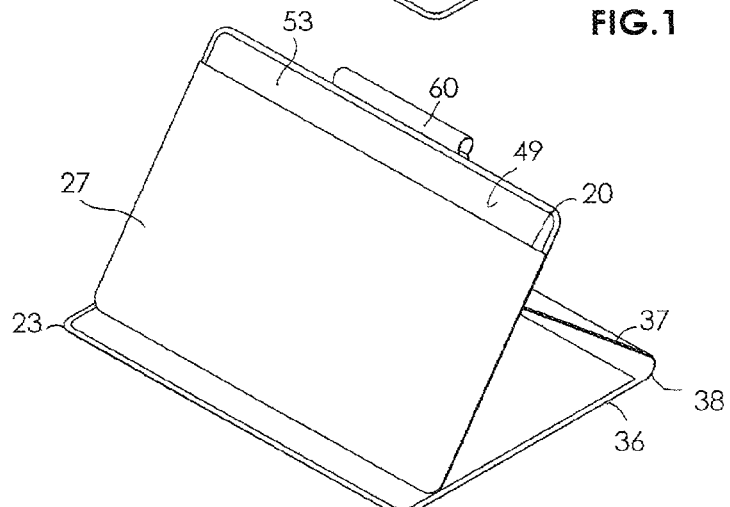
FIG. 2 is a reduced anterior perspective view of a second alternative device-holding panel and case combination or assembly according to the present invention in a first device-display configuration shown with certain device-retention means removed to highlight the second alternative device-holding panel.
Figure 3:
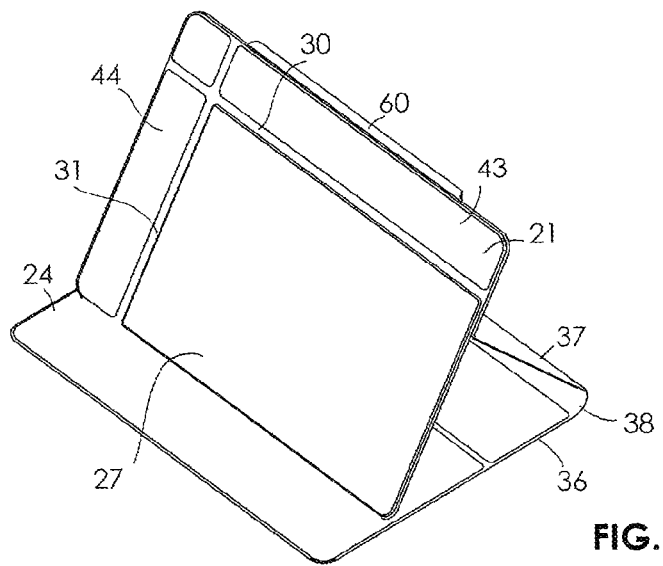
FIG. 3 is a reduced anterior perspective view of a third alternative device-holding panel and case combination or assembly according to the present invention in a first device-display configuration shown with certain device-retention means removed to highlight the third alternative device-holding panel.

As earlier indicated, comparatively referencing FIGS. 1-3, the reader will there see three device-holding panels of three embodiments with the device-retention means removed for ease of understanding. FIG. 1 depicts a first alternative device-holding panel 19; FIG. 2 depicts a second alternative device-holding panel 20; and FIG. 3 depicts a third alternative device-holding panel 21. A first alternative case construction 22 is cooperably associated with device-holding panel 19; a second alternative case construction 23 is cooperably associated with the device-holding panel 20; and a third alternative case construction 24 is cooperably associated with the device-holding panel 21.

For ease of representation, certain device retention means as exemplified by the polymeric device-engaging construction 11 have been cooperably associated with (a) the device-holding panel 19 in FIG. 4 and (b) the device-holding panel 20 in FIG. 5. Certain other device retention means as exemplified by a series of strap-hook assemblies 12 have been cooperably associated with the device-holding panel in FIG. 6. FIGS. 7 and 8 attempt to depict the same device-holding panel 20 and case construction 23 outfitted with (a) the polymeric device-engaging construction 11 (in FIG. 7) and (b) the series of strap-hook assemblies 12 (in FIG. 8).

Each device-holding panel as at panels 19, 20, and 21, when outfitted with certain device-retention means function to removably retain a select or target electronic device as generically depicted and referenced at 10. In connection with those embodiments having panels 20 and 21 and case constructions 23 and 24, the panels 20 and 21 are primarily designed to cooperate with the select electronic device 10 having a select feature function operable via a posterior device portion as at 25. In this regard, the select feature function most often practiced via the posterior device portion is photograph or video camera operability as generically depicted at lines of sight 100 emanating from a camera lens generically or diagrammatically depicted at element 26.

Each of the device-holding panels 20 and 21 according to the present invention, preferably comprises an anterior device-support portion as at 27, a posterior case interface portion as at 28, at least one feature-enabling edge, certain device retention means as exemplified hereinabove, and a first magnetically attractive material construction. The at least one feature-enabling edge of each of the panels 20 and 21 enables the select feature function of the select or target electronic device 10 when the device retention means retain the select or target device 10 in anterior adjacency to the anterior device-support portion(s) 27. Device-holding panel 19 comprises an anterior device-support portion as at 27, a posterior case interface portion as at 28 certain device retention means as exemplified hereinabove, and a first magnetically attractive material construction.

In the case of device-holding panel 20, the at least one feature-enabling edge is depicted and referenced at 29. The device-holding panel 20 preferably comprises a panel width as at 101, a panel length as at 102, a distal panel edge as at 32, and a proximal panel edge as at 33. The at least one feature-enabling edge 29 of device-holding panel 20 coincides with distal panel edge 32. In the case of device-holding panel 21, the at least one feature-enabling edge is depicted and referenced either at landscape feature-enabling portion or edge 30 or portrait feature-enabling portion or edge 31. The reader will thus see that the device-holding panel 21 comprises at least two feature-enabling edges 30 and 31 either of which may be utilized depending on whether the select electronic device 10 comprises a feature or element (e.g. element 26) structurally located at either a portrait edge 34 or a landscape edge 35 of the device 10.

The case constructions 22, 23, and 24 each primarily function to selectively enable (a) respective device-holding panel (and device 10) access when in an open case configuration as generally depicted in FIGS. 1-15, 16, 19-22B, 27-30B, 36-39A, and 57-60; and/or (b) respective device-holding panel (and device 10) encasement when in a closed case configuration as generally depicted in FIGS. 31-35D. Each of the case constructions 22, 23, and 24 according to the present invention preferably comprise an anterior case portion as at 36, a posterior case portion as at 37, an anterior-to-posterior junction section as at 38, and a second magnetically attractive material construction. The anteriorto-posterior junction section(s) 38 enable the user to pivot the anterior case portion(s) 36 relative to the posterior case portion(s) 37.

The anterior case portions 36 are pivotal relative to the posterior case portions 37 via the anterior-to-posterior junction section 38 for selectively (a) uncovering the anterior device-support portions 27 when in the open case configurations, which open case configurations comprise at least one device-display configuration (as generally depicted in FIGS. 1-12A) and (b) covering the anterior device-support portions 27 when in the closed case configuration. The first and second magnetically attractive material constructions are magnetically attractive for selectively and magnetically fastening portions of the device-holding panels 19, 20, and 21 to portions of the case constructions 22, 23, and 24. A securement flap 60, outfitted with magnetically attractive material construction such as magnets 39, may be provided to maintain the closed case configuration.

The magnetically attractive first material construction may be preferably exemplified by a series of panel-based permanent magnets 39 embedded within portions of the device-holding panels 19, 20, and 21. Similarly, the magnetically attractive second material construction may be preferably exemplified by a series of case-based permanent magnets 39 embedded within portions of the case constructions 22, 23, and 24. The magnetically attractive first and second material constructions are thus magnetically attractive for magnetically and respectively fastening the device-holding panels 19, 20, and 21 to the case constructions 22, 23, and 24.

In the case of the device-holding panel 19 and case construction 22, the panel-based permanent magnets 39 are preferably received within apertures 41 formed in apertured panels 40 of both the device-holding panel 19 and the case construction 22. The device-holding panel 19 comprises a first magnetically attractive material construction exemplified by at least one panel-based permanent magnet 39 located at the proximal panel edge 42. The case construction 22 preferably comprises a second magnetically attractive material construction exemplified by at least one case-based permanent magnet 39 located at the anterior case portion 36. Thus the proximal panel edge 42 of device-holding panel 19 is magnetically fastenable to the anterior case portion 36 of the case construction 22 when in a device-display configuration.

In the case of the device-holding panel 20 and case construction 23, the panel-based permanent magnets 39 are preferably received within apertures 41 formed in apertured panels 40 of both the device-holding panel 20 and the case construction 23. The device-holding panel 20 comprises a first magnetically attractive material construction exemplified by at least one panel-based permanent magnet 39 located at the proximal panel edge 33 and adjacent the distal panel edge 32 as generally depicted in FIG. 18. The case construction 23 preferably comprises a second magnetically attractive material construction exemplified by at least one case-based permanent magnet 39 located within the anterior case portion 36. Thus the proximal panel edge 33 of device-holding panel 19 is magnetically fastenable to the anterior case portion 36 of the case construction 23 when in a device-display configuration, and the distal panel edge 32 is magnetically fastenable to the anterior case portion 36 of the case construction 23 when in a closed case configuration.

The posterior case portion 37 of the case construction 23 preferably comprises a back portion width as at 106, a back portion length as at 107, a distal posterior panel as at 49, a proximal posterior panel as at 50, and a distal-to-proximal panel junction section as at 51. The proximal posterior panel 50 comprises a proximal posterior case section as at 52 and the proximal panel edge 33 of the device-holding panel 20 and the proximal posterior case section 52 are aligned when the anterior and posterior case portions 36 and 37 are juxtaposed so as to be extended substantially parallel to one another.

Preferably, the distal-to-proximal junction section 51 is attached to the posterior case interface portion 28. The panel and back portion lengths 102 and 107 are substantially uniform or of the same measurement; however, central to the practice of the embodiment incorporating device-holding panel 20 and case construction 23, the panel width 101 is abbreviated relative to the back portion width 106. The distal posterior panel 49 is pivotal relative to the proximal posterior panel 50 at the distal-to-proximal panel junction section 51 for selectively (a) overlapping the distal panel edge 29 when in a feature-disabling posterior case portion configuration as generally depicted at 108 in FIGS. 7, 8, 10, 13, 14, 19, 20, 22A, 29A, and 30A or (b) exposing the distal panel edge 29 when in a feature-enabling, folded posterior case portion configuration as generally depicted at 109 in FIGS. 21, 22B, 27, 28, 29B, and 30B. The exposed distal panel edge 29 provides the at least one feature-enabling edge when the posterior case portion 37 of case construction 23 is in the folded posterior case portion configuration 109.

As earlier stated, the proximal panel edge 33 of the device-holding panel 20 preferably comprises the first magnetically attractive material construction as exemplified by the panel-based magnets 39, and the anterior case portion 36 preferably comprises the second magnetically attractive material construction as exemplified by the case-based magnets 39. The proximal panel edge 33 is thus magnetically attachable to the anterior case portion 36 when in a device-display configuration as generally depicted in FIGS. 10, 11, 19, 20, 21, 22A, 22B, 27-30B.

In the case of device-holding panels 20 and 21, the device retention means, as variously exemplified, are off-centered relative to the device-holding panel(s) 20 and 21, and centered relative to the posterior case portion(s) 37 when the posterior case portion(s) are in the feature-disabling posterior case portion configuration(s) 108 and 110, the latter of which is generally depicted in FIGS. 36-39A (i.e. when device-holding panel 21 is in a non-folded or fully extended planar device-holding panel configuration as at 103).

The distal posterior panel 49 and the proximal posterior panel 50 of the posterior case portion 37 of the case construction 23 each preferably comprise the second magnetically attractive material construction exemplified by case-based magnets 39 as received in apertures 41 formed in apertured panels 40 such that second magnetically attractive material construction(s) of the panels 49 and 50 are magnetically attractive to one another when the posterior case portion 37 is in the (fully) folded, feature-enabling posterior case portion configuration as at 109 in FIG. 22B for magnetically maintaining said folded posterior case portion configuration 109.

The distal panel edge 32 preferably comprises the first magnetically attractive material construction as exemplified by panel-based magnets 39, and the distal posterior panel 49 preferably comprises the second magnetically attractive material construction, as exemplified by case-based magnets 39 such that the distal panel edge 32 and the distal posterior panel 49 are magnetically attractive when the posterior case portion 37 is in the feature-disabling posterior case portion configuration 108 for magnetically maintaining the feature-disabling posterior case portion configuration 108. Notably, the distal posterior panel 49 may further preferably comprise an anteriorly raised front panel portion as at 53, which panel portion 53 is preferably flush with the anterior device-support portion 27 of the device-holding panel 20 when the posterior case portion 37 is in the feature-disabling posterior case portion configuration 108.

In the case of the device-holding panel 21 and case construction 24, the panel-based permanent magnets 39 are preferably received within apertures 41 formed in apertured panels 40 of both the device-holding panel 21 and the case construction 24. The device-holding panel 21 comprises a first magnetically attractive material construction exemplified by at least one panel-based permanent magnet 39 located within a landscape pivot section 43 and within a portrait pivot section 44. The case construction 24 preferably comprises a second magnetically attractive material construction exemplified by at least one case-based permanent magnet 39 located within both the anterior and posterior case portions 36 and 37.

Thus the landscape pivot section 43 and the portrait pivot section 44 of device-holding panel 21 are selectively and magnetically fastenable to the posterior case portion 37 of the case construction 24 when in first and second device-display configurations as generally depicted in FIGS. 39 and 39A. Further, the landscape pivot panel or section 43 and the portrait pivot panel or section 44 of device-holding panel 21 are selectively and magnetically fastenable to the anterior case portion 36 of the case construction 24 when in a third device display configuration as generally depicted in FIGS. 59 and 60. Other device-display configurations, such as a portrait panel-to-anterior case device-display configuration, are not specifically illustrated.

It will thus be understood that the device-holding panel 21 preferably comprises a distal panel portion defined by a landscape pivot panel section 43, a lateral panel portion defined by a portrait pivot panel section 44, and a medial-proximal panel portion as at panel section 45. The landscape pivot panel section 43 and portrait pivot panel section 44 respectively pivot about pivot sections 46 and 47 that respectively define edges 30 and 31 when pivoted into either a landscape-folded device-holding panel configuration 104 as generally depicted in FIGS. 48-53, or a portrait-folded device-holding panel configuration 105 as generally depicted in FIGS. 41, and 54-56. The landscape pivot panel section 43 and portrait pivot panel section 44 thus respectively provide a landscape feature-enabling portion and a portrait feature-enabling portion.

A select panel portion or pivot panel section is pivotal relative the medial-proximal panel portion 45 for selectively (a) disabling the select feature function when in a non-folded or fully extended planar device-holding panel configuration as at 103 generally depicted in FIGS. 37, 38A, 38B, 39A, 39B, 40, 42-47 and (b) enabling the select feature function when in a folded device-holding panel configuration as at either 104 or 105 in FIGS. 41, and 48-56. The select panel portion or pivot panel section is selected from the group consisting of the landscape and portrait pivot panel sections 43 and 44, and folded device-holding configuration 104 provides the at least one feature-enabling edge as at either edge 30 or edge 31. The reader will note that a corner pivot panel or section 48 is included in both the lateral and portrait pivot panel sections 43 and 44.

In the case of the device-holding panel 21, the device retention means, as variously exemplified, are preferably off-centered relative to medial-proximal panel 45, but centered relative to the device-holding panel 21 when in the feature-disabling device-holding panel configuration 103.

As earlier stated, the select panel portion may be preferably selected (as selected from pivot panel sections 43 and 44) and folded or re-oriented for providing either (a) a portrait-orientation feature-enabling edge as at edge 31 or (b) a landscape-orientation feature-enabling edge as at edge 30.

The select panel portion and the medial-proximal panel portion 45 may each preferably comprise the first magnetically attractive material construction, as exemplified by panel-based magnets 39 such that the first material construction(s) of the select panel portion and the medial-proximal panel portion are magnetically attractive when the select panel portion is in either of the folded device-holding panel configurations 104 or 105 for magnetically maintaining the selected and folded device-holding panel configuration.

The posterior case portion 37 of case construction 24 preferably comprises a distal posterior panel as at 54, a proximal posterior panel as at 55, and a distal-to-proximal junction section as at 56. The distal posterior panel 54 is thus pivotal relative to the proximal posterior panel 55 about the distal-to-proximal junction section 56 for enhancing the user's ability to provide the device-display configuration. In this regard, the reader may comparatively reference FIGS. 39 and 39A versus FIGS. 59 and 60.

FIGS. 39 and 39A respectively depict portrait and landscape panel orientations of the device-holding panel 21 magnetically coupled to the case construction 23 via the distal posterior panel 54 while in an open case configuration, and FIGS. 59 and 60 respectively depict first and second or top and bottom perspectives of a landscape orientation of the device-holding panel 21 magnetically coupled to the case construction 23 when in a closed triangular case configuration in which the distal posterior panel 54 is coplanar with the proximal posterior panel 55.

As prefaced above, the various panels outfitted with magnetically attractive material constructions as exemplary constructions may each preferably comprise an apertured panel or construction as at apertured panel 40 various depicted and referenced in FIGS. 25 and 26 in particular. Apertures 41 formed in the apertured panels 40 respectively receive and position the panel-based and case-based magnets 39. The apertured panels 40 each have a preferred material thickness that is the substantially the same as the thickness of magnets 39 as at thickness 111.

To help structurally secure the magnets 39 within the apertures 41 formed in the apertured panels 40, a thin lamination material layer 57 may be applied (as at arrows 112) to one or both sides of the apertured panels 40 as comparatively depicted in FIGS. 25 and 26. In other words, the device-holding panels 19, 20, and 21 and the case constructions 22, 23, and 24 may each preferably comprise at least one lamination layer 57 for respectively securing the first and second magnetically attractive material constructions within the apertures 41 formed in the apertured panels 40.

First and second outer concealing material layers as at 58 cover or conceal the apertured panels 40 and lamination layer(s) 57. The first outer concealing material layer may preferably have a first ornamental effect and covers or conceals the apertured panel(s) 40 from a first direction or on a first side of the apertured panel(s) 40, while a second outer or concealing material layer 58 has a second ornamental effect and covers or conceals the apertured panel(s) 40 from a second direction or on a second side of the apertured panel(s) 40.

Notably, the apertures 41 formed in the aperture panels 40 may preferably extend orthogonally through the entire said aperture panels 40 for enabling and/or enhancing enable bidirectional or oppositely directed magnetic attractive forces via the apertured panels 40 as at arrows 113 in FIG. 26. Further, the first outer or concealing material layer 58 has a first ornamental effect as generically depicted by a first set of representative vertical hatch markings 114, and that the second outer or concealing material layer 58 has a second ornamental effect as generically depicted by a second set of representative horizontal hatch markings 115.

The present invention contemplates a case construction at least at construction 24 wherein the first and second outer case portions or layers 58 are reversible and comprise differing ornamental appearances. The differing ornamental appearances of the reversible first and second outer case portions or layers 58 of at least case construction 24 enables the user to selectively display an outer case material. The bi-directional magnetic attraction as at arrows 113 further enables the user to magnetically fasten the device-holding panel 21 to either of two reversible sides/layers 58 of the posterior case portion 37 the case construction 24.

While the above descriptions contain much specificity, this specificity should not be construed as limitations on the scope of the invention, but rather as an exemplification of the invention. In certain embodiments, the basic invention may be said to essentially teach or disclose a device-holding case construction for an electronic device having a select feature function operable via a posterior device portion, which device-holding case construction essentially comprises a device-holding panel for removably retaining a select device, and a case construction for selectively enabling (a) device-holding panel access and (b) device-holding panel encasement.

The device-holding panel(s) according to the present invention preferably comprise an anterior device-support portion, a posterior case interface portion, at least one feature-enabling edge, certain device retention means for retaining the select device in anterior adjacency to the anterior device-support portion, and a first magnetically attractive material construction. The at least one feature-enabling edge enables the user to operate the select feature function operable via a posterior device portion when the device retention means retain said select device in anterior adjacency to the anterior device support portion.

The case construction comprises an anterior case portion, a posterior case portion, an anterior-to-posterior junction section, and a second magnetically attractive material construction. The anterior-to-posterior junction section enables the user to pivot the anterior case portion relative to the posterior case portion. The anterior case portion is thus pivotal relative to the posterior case portion via the anterior-to-posterior junction section for selectively (a) uncovering the anterior device-support portion in open case configurations and (b) covering the anterior device-support portion in a closed case configuration.

The open case configurations comprise at least one device-display configuration. The first and second magnetically attractive material constructions are magnetically attractive for selectively and magnetically fastening the device-holding panel to the case construction. It is believed that the foregoing descriptions embrace device-holding panel—case construction combinations including device-holding panels 20 and 21 and case constructions 23 and 24 and which device-holding panels 20 and 21 may be variously outfitted with certain device retention means as variously exemplified.

In the device-holding panel—case construction combination including panel 20 and case construction 23, the device-holding panel 20 preferably comprises a panel width, a panel length, a distal panel edge, and a proximal panel edge. The posterior case portion 37 of case construction 23 preferably comprises a back portion width, a back portion length, a distal posterior panel, a proximal posterior panel, and a distal-to-proximal panel junction section.

The proximal posterior panel essentially comprises a proximal posterior case section, and when the proximal panel edge and the proximal posterior case section are aligned, the panel and back portion lengths are substantially uniform, but the panel width is abbreviated relative to the back portion width. The distal posterior panel is pivotal relative to the proximal posterior panel at the distal-to-proximal panel junction section for selectively (a) overlapping the distal panel edge when in a feature-disabling posterior case portion configuration or (b) exposing the distal panel edge when in a feature-enabling posterior case portion configuration. The exposed distal panel edge provides the at least one feature-enabling edge when the posterior case portion is in the feature-enabling posterior case portion configuration. The distal-to-proximal junction section may be preferably attached to the posterior case interface portion.

In the device-holding panel—case construction combination including panel 21 and case construction 24, the device-holding panel 21 preferably comprises a distal panel portion or landscape pivot section as at 43, a lateral panel portion or portrait pivot section as at 44, and a medial-proximal panel portion as at 45. A select panel portion is pivotal relative the medial-proximal panel portion for selectively (a) disabling the select feature function when in a feature-disabling (planar) device-holding panel configuration and (b) enabling the select feature function when in a feature-enabling (folded) device-holding panel configuration. The select panel portion may be selected from the group consisting of the landscape and portrait pivot sections, and the feature-enabling configuration provides the at least one feature-enabling edge.

In a certain preferred alternative embodiment, the basic invention may be said to alternatively and essentially teach or disclose a device-holding case construction for an electronic device having a select feature function operable via a posterior device portion, in which the device-holding case construction preferably comprises a device-holding panel for removably retaining a select device, and a case construction for selectively enabling (a) device-holding panel access and (b) device-holding panel encasement.

The device-holding panel of the preferred alternative embodiment (as at device-holding panel 21) may be said to comprise an anterior device-support portion, a posterior case interface portion, a landscape feature-enabling portion, a portrait feature-enabling portion, and certain device retention means for retaining the select electronic device in anterior adjacency to the anterior device-support portion. The landscape and portrait feature-enabling portions enable the select feature function when the device retention means retain the select device in anterior adjacency to the anterior device-support portion.

The case construction (as at case construction 24) may be said to comprise an anterior case portion, a posterior case portion, and an anterior-to-posterior junction section, which anterior-to-posterior junction section enables the user to pivot the anterior case portion relative to the posterior case portion. The anterior case portion is pivotal relative to the posterior case portion via the anterior-to-posterior junction section for selectively (a) uncovering the anterior device-support portion in open case configurations, and (b) covering the anterior device-support portion in a closed case configuration.

It is believed that the foregoing descriptions may properly describe the combination of device-holding panel 21 and case construction 24. The device-holding panel 21 may preferably further comprise a first magnetically attractive material construction and the case construction 24 may preferably further comprise a second magnetically attractive material construction. The first magnetically attractive material construction is magnetically attracted to the second magnetically attractive material constructions for selectively and magnetically fastening the device-holding panel 21 to the case construction 24.

Both the device-holding panel and the case construction of the device-holding panel—case construction combination according to the present invention may further preferably comprise an apertured panel outfitted with apertures. The first and second magnetically attractive material constructions are respectively received in the apertures formed in the apertured panels. The apertures formed in the apertured panels of the device-holding panel and/or case construction may preferably extend entirely through the respective apertured panels for enhancing bidirectional magnetic attractive forces via the apertured panels.

The device-holding panel and/or the case construction may further preferably comprise first and second outer portions or material layers. The first and second outer portions or material layers may be reversible and comprise differing ornamental appearances as at hatch markings 114 and 115. The differing ornamental appearances of the reversible first and second outer portions or layers enable the user to selectively display an outer material layer, and the bidirectional magnetic attractive forces enable the user to magnetically fasten the device-holding panel to either of two reversible sides of the case construction.

In certain other alternative embodiments, the basic invention may be said to alternatively and essentially teach or disclose a device-holding case construction for an electronic device, which device-holding case construction essentially comprises a device-holding panel for removably retaining a select device, and a case construction for selectively enabling (a) device-holding panel access and (b) device-holding panel encasement.

The device-holding panel(s) of certain embodiments may be said to preferably comprise an anterior device-support portion, a posterior case interface portion, an upper panel edge as at 29 or 59, a lower panel edge as at 33 or 42, and certain device retention means for retaining the select device in anterior adjacency to the anterior device-support portion. The lower panel edge(s) may preferably comprise a first magnetically attractive material construction.

The case construction(s) of certain embodiments may be said to preferably comprise an anterior case portion, a posterior case portion, and an anterior-to-posterior junction section, which anterior-to-posterior junction section enables the user to pivot the anterior case portion relative to the posterior case portion, and which anterior case portion preferably comprises a second magnetically attractive material construction.

The anterior case portion is pivotal relative to the posterior case portion via the anterior-to-posterior junction section for selectively (a) uncovering the anterior device-support portion in open case configurations, and (b) covering the anterior device-support portion in a closed case configuration. The first and second magnetically attractive material constructions are magnetically attractive for magnetically fastening the lower panel edge of the device-holding panel to the anterior case portion of the case construction when in the device-display configuration.

It is believed that the foregoing descriptions embrace the embodiments including device-holding panels 19 and 20 and case constructions 22 and 23. The device-holding case construction embracing device-holding panel 20 and case construction 22 may preferably comprise certain device retention means that are off-centered relative to the device-holding panel and centered relative to the posterior case portion when the posterior case portion is in the feature-disabling posterior case portion configuration.

Although the inventive device-holding panel-case construction combinations or device-holding case constructions according to the present invention has been described by reference to a number of different embodiments, it is not intended that the novel combinations or assemblies be limited thereby, but that modifications thereof are intended to be included as falling within the broad scope and spirit of the foregoing disclosure, the appended drawings, and perhaps most importantly, the following claims.

I claim:

1. A device-holding case assembly for an electronic device, the device-holding case assembly comprising:

a device-holding panel assembly for removably retaining a select device, the select device having a select feature function operable via a posterior device portion, the device-holding panel assembly comprising an anterior device-support portion, a posterior case interface portion, a series of resilient device retention elements, a landscape pivot panel, a portrait pivot panel, a corner pivot panel, a medial-proximal panel, a landscape pivot section, a portrait pivot section, and a first material construction; and a case construction, the case construction for selectively enabling (a) device-holding panel assembly access and (b) device-holding panel assembly encasement and comprising an anterior case portion, a posterior case portion, an anterior-to-posterior junction section, and a second material construction, the anterior case portion being pivotal relative to the posterior case portion via the anterior-to-posterior junction section for selectively (a) uncovering the anterior device-support portion in open case configurations, the open case configurations comprising a device-display configuration and (b) covering the anterior device-support portion in a closed case configuration, the first and second material constructions being magnetically attractive for selectively and magnetically fastening the device-holding panel assembly to the case construction;

the series of resilient device retention elements for resiliently retaining the select device in anterior adjacency to the anterior device-support portion, the landscape pivot section being orthogonal to the portrait pivot section, the landscape pivot section pivotally separating the landscape pivot panel and the corner pivot panel from the portrait pivot panel and the medial-proximal panel, the portrait pivot section pivotally separating the portrait pivot panel and the corner pivot panel from the landscape pivot panel and the medial-proximal panel, the landscape pivot panel and the corner pivot panel being pivotal about the landscape pivot section relative to the medial-proximal panel and the portrait pivot panel for forming a landscape feature-enabling edge, the portrait pivot panel and the corner pivot panel being pivotal about the portrait pivot section relative to the medial-proximal panel and the landscape pivot panel for forming a portrait feature-enabling edge, the corner pivot panel being co-extensive with both the landscape pivot panel and the portrait pivot panel and pivotal about both the landscape pivot section and the portrait pivot section, the landscape feature-enabling edge and the portrait feature-enabling edge selectively enabling said select feature function when said series of resilient device retention elements resiliently retain said select device.

2. The device-holding case assembly of claim 1 wherein a select panel is pivotal relative the medial-proximal panel for selectively (a) disabling the select feature function when in a feature-disabling device-holding panel configuration and (b) enabling the select feature function when in a feature-enabling device-holding panel configuration, the select panel being selected from the group consisting of the landscape pivot panel and the portrait pivot panel.

3. The device-holding case assembly of claim 2 wherein the series of resilient device retention elements are off-centered relative to medial-proximal panel and centered relative to the device-holding panel assembly when in the feature-disabling device-holding panel configuration.

4. The device-holding case assembly of claim 2 wherein the select panel and the medial-proximal panel each comprise the first material construction, the first material construction of the select panel and the medial-proximal panel being magnetically attractive when the select panel is in the feature-enabling device-holding panel configuration for magnetically maintaining said feature-enabling device-holding panel configuration.

5. The device-holding case assembly of claim 2 wherein the posterior case portion comprises a distal posterior panel, a proximal posterior panel, and a distal-to-proximal junction section, the distal panel being pivotal relative to the proximal posterior panel about the distal-to-proximal junction section for enhancing the user's ability to provide the device-display configuration.

6. A device-holding case assembly for an electronic device, the device-holding case assembly comprising:
a device-holding panel assembly for removably retaining a select device, the select device having a select feature function operable via a posterior device portion, the device-holding panel assembly comprising an anterior device-support portion, a posterior case interface portion, a series of resilient device retention elements, a landscape pivot panel, a portrait pivot panel, a medial-proximal panel, a landscape pivot section, and a portrait pivot section; and
a case construction, the case construction for selectively enabling (a) device-holding panel assembly access and (b) device-holding panel assembly encasement and comprising an anterior case portion, a posterior case portion, and an anterior-to-posterior junction section, the anterior case portion being pivotal relative to the posterior case portion via the anterior-to-posterior junction section for selectively (a) uncovering the anterior device-support portion in open case configurations and (b) covering the anterior device-support portion in a closed case configuration;
the series of resilient device retention elements for resiliently retaining the select device in anterior adjacency to the anterior device-support portion, the landscape pivot section being orthogonal to the portrait pivot section, the landscape pivot section extending intermediate the landscape pivot panel and the medial-proximal panel, the portrait pivot section extending intermediate the portrait pivot panel and the medial-proximal panel, the landscape pivot panel being pivotal about the landscape pivot section relative to the medial-proximal panel for forming a landscape feature-enabling edge, the portrait pivot panel being pivotal about the portrait pivot section relative to the medial-proximal panel for forming a portrait feature-enabling edge, the landscape and portrait feature-enabling edges selectively enabling said select feature function when said resilient device retention elements resiliently retain said select device.

7. The device-holding case assembly of claim 6 wherein the device-holding panel assembly comprises a first magnetically attractive material construction and the case construction comprises a second magnetically attractive material construction, the first magnetically attractive material construction being magnetically attracted to the second magnetically attractive material construction for selectively and magnetically fastening the device-holding panel assembly to the case construction.

8. The device-holding case assembly of claim 7 wherein the device-holding panel assembly and the case construction each comprise an apertured panel, the first and second magnetically attractive material constructions being respectively received in apertures formed in the apertured panels.

9. The device-holding case assembly of claim 8 wherein the apertures formed in the apertured panels of the device-holding panel assembly and the case construction respectively extend entirely through said apertured panels, the first and second magnetically attractive material constructions, being received in said apertures, thereby enhancing bidirectional magnetic attractive forces via said apertured panels.

10. The device-holding case assembly of claim 9 wherein the case construction comprises first and second outer material layers, the first and second outer material layers being reversible and comprising differing ornamental appearances, the differing ornamental appearances of the first and second outer material layers for enabling the user to selectively display an outer case material, the bidirectional magnetic attractive forces for enabling the user to magnetically fasten the device-holding panel assembly to either of two reversible sides of the case construction.

11. The device-holding case construction of claim 6 wherein the device-holding panel assembly comprises a corner pivot panel, the corner pivot panel being co-extensive with both the landscape and portrait pivot panels and pivotal about both the landscape and portrait pivot sections.

12. A device-holding case assembly for an electronic device, the device-holding case assembly comprising:
a device-holding panel assembly for removably retaining a select device, the device-holding panel assembly comprising an anterior device-support portion, a posterior case interface portion, a series of resilient device retention elements, a landscape pivot panel, a portrait pivot panel, a medial-proximal panel, a landscape pivot section, and a portrait pivot section the landscape and portrait feature enabling portions for selectively enabling device functionality; and
a case construction, the case construction for selectively enabling (a) device-holding panel assembly access and (b) device-holding panel assembly encasement and comprising an anterior case portion, a posterior case portion, and an anterior-to-posterior junction section, the anterior case portion being pivotal relative to the posterior case portion via the anterior-to-posterior junction section for selectively (a) uncovering the anterior device-support portion in open case configurations and (b) covering the anterior device-support portion in a closed case configuration;
the series of resilient device retention elements for retaining the select device in anterior adjacency to the anterior device-support portion, the landscape pivot section being orthogonal to the portrait pivot section, the landscape pivot section extending intermediate the landscape pivot panel and the medial-proximal panel, the portrait pivot section extending intermediate the portrait pivot panel and the medial-proximal panel, the landscape pivot panel being pivotal about the landscape pivot section relative to the medial-proximal panel for forming a landscape feature-enabling edge, the portrait pivot panel being pivotal about the portrait pivot section relative to the medial-proximal panel for forming a portrait feature-enabling edge, the landscape and portrait feature-enabling edges selectively enabling a select feature function when said series of resilient device retention elements retain said select device.

13. The device-holding case assembly of claim 12 wherein the device-holding panel assembly comprises a first magnetically attractive material construction and the case construction comprises a second magnetically attractive material construction, the first magnetically attractive material construction being magnetically attracted to the second magnetically attractive material construction for selectively and magnetically fastening the device-holding panel assembly to the case construction.

14. The device-holding case assembly of claim 13 wherein the case construction comprises first and second outer material layers, the first and second outer material layers being reversible and comprising differing ornamental appearances, the differing ornamental appearances of the first and second outer material layers for enabling the user to selectively display an outer case material.

15. The device-holding case assembly of claim 14 wherein a select panel is pivotal relative the medial-proximal panel for selectively (a) disabling a select feature function when in a feature-disabling device-holding panel configuration and (b) enabling the select feature function when in a feature-enabling device-holding panel configuration, the select panel being selected from the group consisting of the landscape and portrait pivot panels.

16. The device-holding case assembly of claim 15 wherein the resilient device retention elements are collectively off-centered relative to the medial-proximal panel and centered relative to the device-holding panel assembly when in the feature-disabling device-holding panel configuration.

17. The device-holding case construction of claim 15 wherein the select panel and the medial-proximal panel each comprise the first magnetically attractive material construction, the first magnetically attractive material construction of the select panel and the medial-proximal panel are magnetically attractive when the select panel is in the feature-enabling device-holding panel configuration for magnetically maintaining said feature-enabling device-holding panel configuration.

18. The device-holding case construction of claim 12 wherein the posterior case portion comprises a distal posterior panel, a proximal posterior panel, and a distal-to-proximal junction section, the distal panel being pivotal relative to the proximal posterior panel about the distal-to-proximal junction section for enhancing the user's ability to provide a device-display configuration.

19. The device-holding case construction of claim 12 wherein the device-holding panel assembly comprises a corner pivot panel, the corner pivot panel being co-extensive with both the landscape and portrait pivot panels and pivotal about both the landscape and portrait pivot sections.

* * * * *